(12) United States Patent
Smith et al.

(10) Patent No.: US 12,304,664 B2
(45) Date of Patent: May 20, 2025

(54) MANEUVERING A SPACECRAFT USING AN OPTIMIZED GUIDANCE TRAJECTORY AND MODEL PREDICTIVE CONTROL

(71) Applicant: Space Dynamics Laboratory, North Logan, UT (US)

(72) Inventors: Tyson Smith, Logan, UT (US); John Akagi, Logan, UT (US); Greg Droge, Logan, UT (US)

(*) Notice: Subject to any disclaimer, the term of this patent is extended or adjusted under 35 U.S.C. 154(b) by 120 days.

(21) Appl. No.: 18/465,505

(22) Filed: Sep. 12, 2023

(65) Prior Publication Data
US 2024/0002072 A1 Jan. 4, 2024

Related U.S. Application Data

(63) Continuation-in-part of application No. 17/891,968, filed on Aug. 19, 2022, which is a continuation-in-part of application No. 17/689,038, filed on Mar. 8, 2022, now Pat. No. 12,129,051.

(51) Int. Cl.
*B64G 1/24* (2006.01)
*B64G 1/10* (2006.01)
*G06F 30/20* (2020.01)

(52) U.S. Cl.
CPC .......... *B64G 1/244* (2019.05); *B64G 1/1085* (2013.01); *G06F 30/20* (2020.01)

(58) Field of Classification Search
CPC ...... B64G 1/242; B64G 1/2422; B64G 1/247; B64G 1/646; B64G 3/00; B64G 1/1085; G06F 30/20
See application file for complete search history.

(56) References Cited

U.S. PATENT DOCUMENTS

| | | | |
|---|---|---|---|
| 2008/0177430 A1* | 7/2008 | Tekawy | B64G 1/413 701/13 |
| 2017/0247123 A1* | 8/2017 | Turner | B64G 1/1007 |
| 2018/0233054 A1 | 8/2018 | Woon et al. | |
| 2019/0049999 A1* | 2/2019 | Weiss | B64G 1/28 |
| 2020/0055617 A1* | 2/2020 | Grover | B64G 1/244 |
| 2022/0063842 A1* | 3/2022 | Weiss | B64G 1/646 |
| 2022/0363415 A1* | 11/2022 | Conn | B64G 1/244 |

OTHER PUBLICATIONS

"Office Action Summary", USPTO, Jul. 25, 2024, pp. 1-48.
(Continued)

*Primary Examiner* — Wade Miles
*Assistant Examiner* — Mohammed Yousef Abuelhawa

(57) ABSTRACT

For maneuvering a spacecraft, a method calculates a virtual point that represents a plurality of spacecraft orbiting in a spacecraft formation. The method further iteratively calculates an inner polytope boundary relative to the virtual point for a given spacecraft of the plurality of spacecraft. In response to determining the inner polytope boundary will be breached, the method maneuvers the given spacecraft to within the inner polytope boundary based on a switching condition, a guidance law, and model predictive control to minimize fuel consumption.

17 Claims, 25 Drawing Sheets

(56) References Cited

OTHER PUBLICATIONS

Augenstein et al., "Optimal Scheduling of a Constellation of Earth-Imaging Satellites, for Maximal Data Throughput and Efficient Human Management", Proceedings of the Twenty-Sixth International Conference on Automated Planning and Scheduling, vol. 26, Association for the Advancement of Artificial Intelligence, 2016, pp. 1-8.
H.Shang et al., "Design and optimization of low-thrust orbital phasing maneuver", Aerospace Science adn Technology No. 42, Feb. 7, 2015, pp. 365-375.
M. Pontani et al., "Nonlinear Earth orbit control using low-thrust propulsion", Acta Astronautica, No. 179, Oct. 21, 2020, pp. 296-310.
"Notice of Allowance and Fees Due", United States Patent and Trademark Office, Aug. 2, 2024, pp. 1-9.

\* cited by examiner

201 

| Spacecraft State 203 |
| Distance Threshold 205 |
| Outer Polytope Boundary 207 |
| Inner Polytope Boundary 209 |
| Matrix Constraint 211 |
| First Objective Function 213a |
| Second Objective Function 213b |
| Third Objective Function 213c |
| Fourth Objective Function 213d |
| Maneuver Strategy 215 |
| Velocity Change 217 |
| Model Predictive Controller 219 |

| Orbital Data 221 |
| Switching Strategy 223 |
| Drift Horizon 225 |
| ROE Data 227 |
| Drift State 241 |
| Controller Weights 243 |
| Guidance Trajectory 245 |
| Simulation 247 |
| Control 249 |
| Switching Condition 251 |
| Guidance Law 253 |
| Model Predictive Control 255 |
| Fuel Consumption 257 |

FIG. 2C

MANEUVERING A SPACECRAFT USING AN OPTIMIZED GUIDANCE TRAJECTORY AND MODEL PREDICTIVE CONTROL

CROSS-REFERENCE TO RELATED APPLICATIONS

This application is a continuation-in-part of and claims priority to U.S. patent application Ser. No. 17/891,968 entitled "MODEL PREDICTIVE CONTROL FOR SPACECRAFT FORMATION" and filed on Aug. 19, 2022, for Tyson Smith, which is incorporated herein by reference, and which claims priority to U.S. patent application Ser. No. 17/689,038 entitled "MODEL PREDICTIVE CONTROL FOR SPACECRAFT FORMATION" and filed on Mar. 8, 2022, for Tyson Smith, which is incorporated herein by reference.

BACKGROUND INFORMATION

The subject matter disclosed herein relates to maneuvering a spacecraft using an optimized guidance trajectory and model predictive control.

BRIEF DESCRIPTION

A method for maneuvering a spacecraft is disclosed. The method calculates a virtual point that represents a plurality of spacecraft orbiting in a spacecraft formation. The method further iteratively calculates an inner polytope boundary relative to the virtual point for a given spacecraft of the plurality of spacecraft. In response to determining the inner polytope boundary will be breached, the method maneuvers the given spacecraft to within the inner polytope boundary based on a switching condition, a guidance law, and model predictive control to minimize fuel consumption. An apparatus and computer program product for practicing the method are also disclosed.

BRIEF DESCRIPTION OF DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 2C is a schematic block diagram illustrating one embodiment of spacecraft data;

DETAILED DESCRIPTION

Figure 1A:
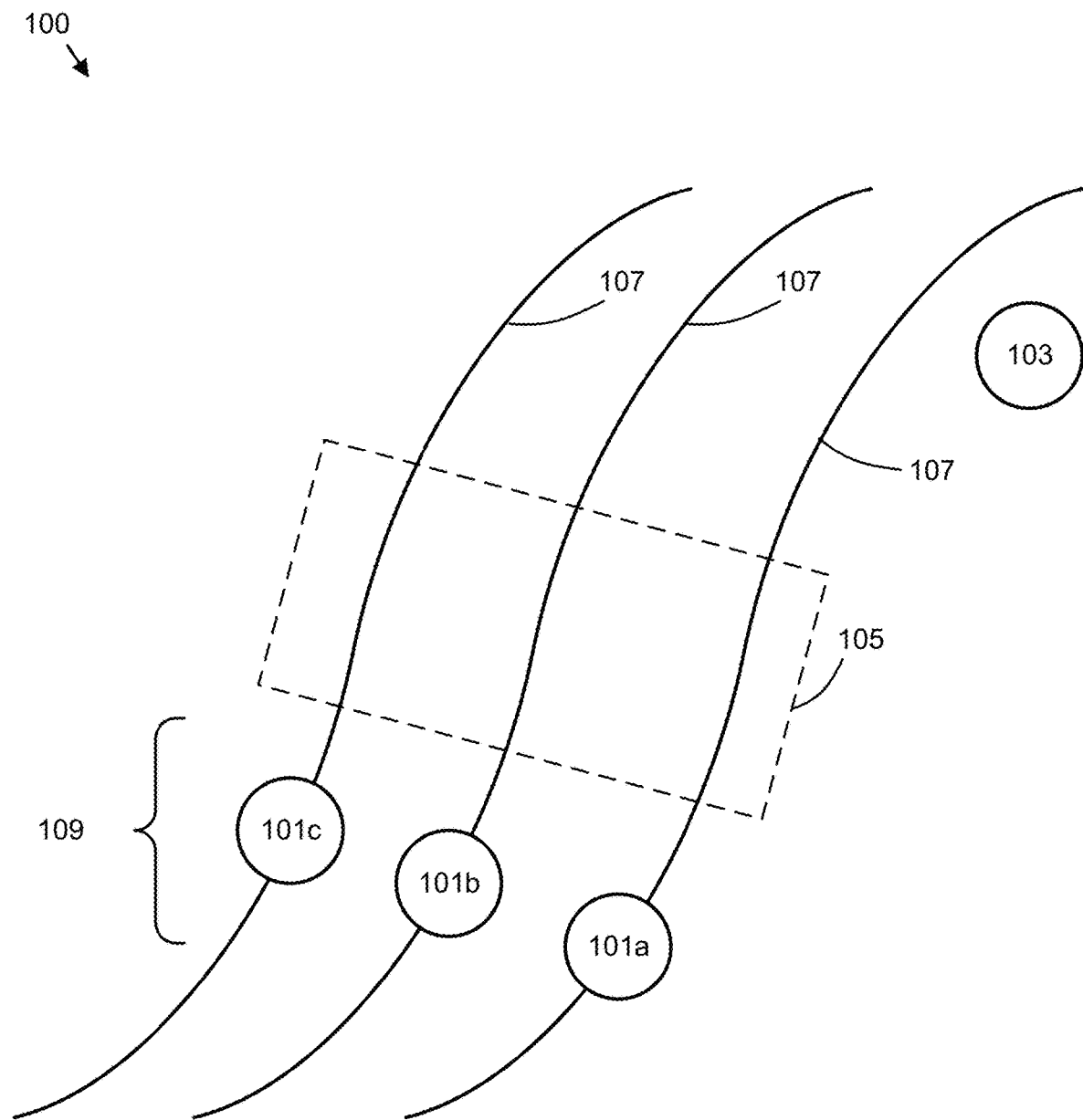
FIG. 1A is a schematic diagram illustrating one embodiment of a spacecraft constellation.

As will be appreciated by one skilled in the art, aspects of the embodiments may be embodied as a system, method, or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing computer readable code. The storage devices may be tangible, non-transitory, and/or non-transmission.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in computer readable code and/or software for execution by various types of processors. An identified module of computer readable code may, for instance, comprise one or more physical or logical blocks of executable code which may, for instance, be organized as an object, procedure, or function. Nevertheless, the executables of an identified module need not be physically located together but may comprise disparate instructions stored in different locations which, when joined logically together, comprise the module and achieve the stated purpose for the module.

Indeed, a module of computer readable code may be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different computer readable storage devices, and may exist, at least partially, merely as electronic signals on a system or network. Where a module or portions of a module are implemented in software, the software portions are stored on one or more computer readable storage devices.

Any combination of one or more computer readable medium may be utilized. The computer readable medium may be a computer readable signal medium or a computer readable storage medium. The computer readable storage medium may be a storage device storing the computer readable code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable code embodied therein, for example, in baseband or as part of a carrier wave. Such a propagated signal may take any of a variety of forms, including, but not limited to, electro-magnetic, optical, or any suitable combination thereof. A computer readable signal medium may be any storage device that is not a computer readable storage medium and that can communicate, propagate, or transport a program for use by or in connection with an instruction execution system, apparatus, or device. Computer readable code embodied on a storage device may be transmitted using any appropriate medium, including but not limited to wireless, wire line, optical fiber cable, Radio Frequency (RF), etc. or any suitable combination of the foregoing.

Computer readable code for carrying out operations for embodiments may be written in any combination of one or more programming languages, including an object-oriented programming language such as Python, Ruby, R, Java, Java Script, Smalltalk, C++, C sharp, Lisp, Clojure, PHP, MATLAB, or the like and conventional procedural programming languages, such as the "C" programming language or similar programming languages. The computer readable code may execute entirely on a spacecraft or ground station computer, partly on the spacecraft or ground station computer, as a stand-alone software package, partly on the spacecraft computer and partly on a ground station computer or entirely on the ground station remote computer or server. In the latter scenario, the remote computer may be connected to the spacecraft computer through any type of network.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise. The term "and/or" indicates embodiments of one or more of the listed elements, with "A and/or B" indicating embodiments of element A alone, element B alone, or elements A and B taken together.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

The embodiments may transmit data between electronic devices. The embodiments may further convert the data from a first format to a second format, including converting the data from a non-standard format to a standard format and/or converting the data from the standard format to a non-standard format. The embodiments may modify, update, and/or process the data. The embodiments may store the received, converted, modified, updated, and/or processed data. The embodiments may provide remote access to the data including the updated data. The embodiments may make the data and/or updated data available in real time. The embodiments may generate and transmit a message based on the data and/or updated data in real time. The embodiments may securely communicate encrypted data. The embodiments may organize data for efficient validation. In addition, the embodiments may validate the data in response to an action and/or a lack of an action.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by computer readable code. These computer readable code may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The computer readable code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The computer readable code may also be loaded onto a computer, other programmable data processing apparatus, or other devices to cause a series of operational steps to be performed on the computer, other programmable apparatus or other devices to produce a computer implemented process such that the program code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable code.

The description of elements in each figure may refer to elements of proceeding figures. Like numbers refer to like elements in all figures, including alternate embodiments of like elements.

FIG. 1A is a schematic diagram illustrating one embodiment of a spacecraft constellation 100. In the depicted embodiment, a plurality of spacecraft 101 are shown traversing orbital tracks 107. The spacecraft 101 may be orbiting in a spacecraft formation 109 to perform a mission objective such as capturing data in a target area 105. Capturing data may include but is not limited to gravitational mapping, capturing images, capturing sensor data, making measurements, communicating with ground stations 103 on the ground, communicating with another spacecraft 101, and the like.

A spacecraft 101 may need to maneuver to remain in the spacecraft formation 109. For example, a mission may require the spacecraft 101 to maintain a separation distance. In addition, the spacecraft 101 may maneuver to avoid debris or perform a mission objective. Maneuvers are complicated by a need to maintain the spacecraft formation 109 and/or separations distances. In addition, maneuvers are constrained by a need to reduce fuel consumption. Unfortunately, both communication bandwidth to the spacecraft 101 and/or on spacecraft computing resources may be limited. As a result, the spacecraft 101 may need to calculate maneuvers with restricted computing resources. In addition, a ground station 103 may need to calculate maneuvers for many spacecraft 101 concurrently.

The embodiments described herein employ model predictive control (MPC) with polytope boundaries to determine and maintain guidance trajectories for a spacecraft formation 109. The embodiments may simplify the calculations so that a spacecraft 101 may perform the calculations autonomously. In addition, the embodiments may speed the calculations for maneuvers at the ground station 103. As a result, the efficiency of a computer controlling the spacecraft 101 is improved.

Figure 1B:
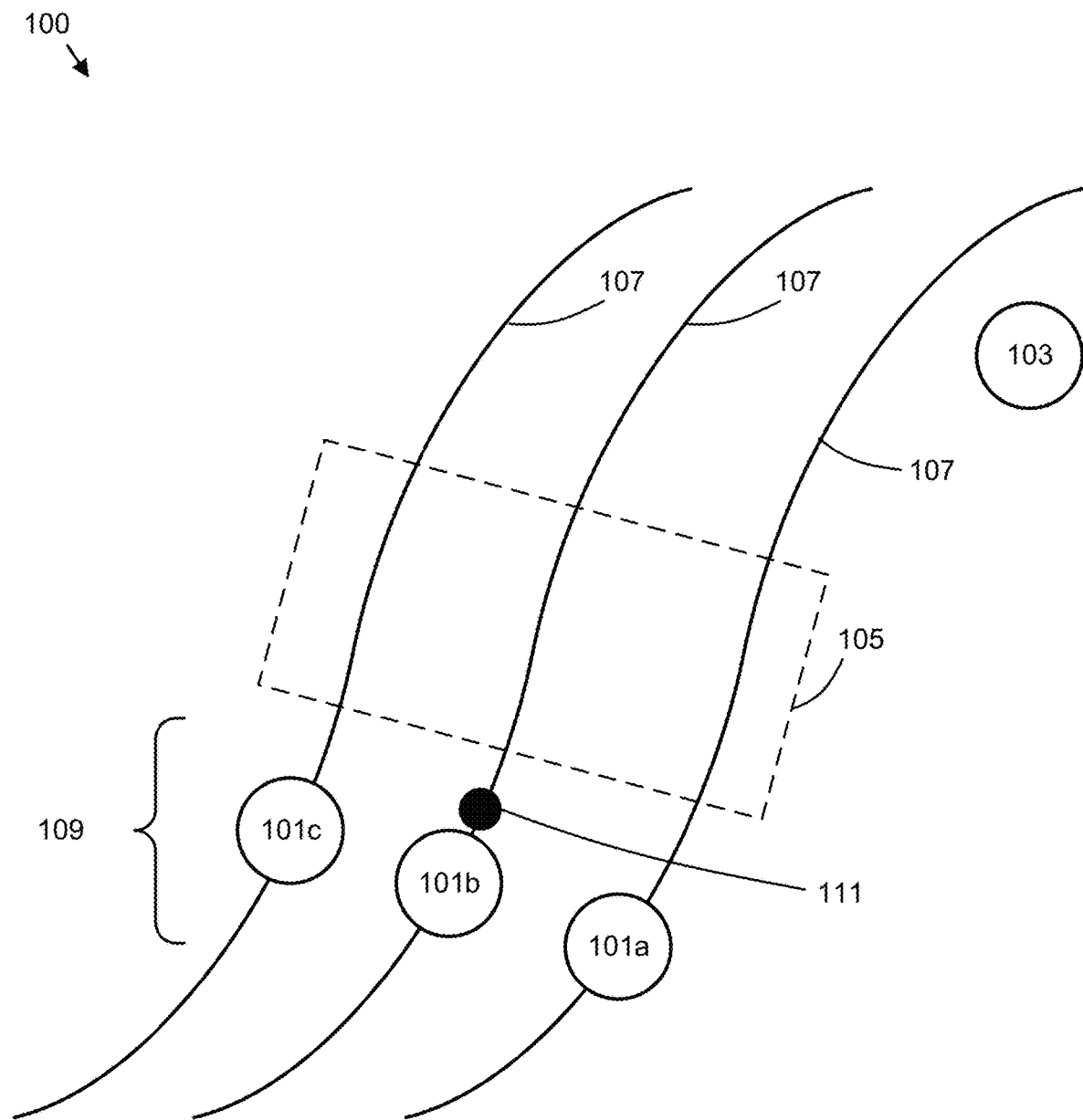
FIG. 1B is a schematic diagram illustrating one alternate embodiment of a spacecraft constellation.

FIG. 1B is a schematic diagram illustrating one alternate embodiment of the spacecraft constellation 100. In the depicted embodiment, a virtual point 111 is shown for the spacecraft formation 109. The virtual point 111 may be used to design a reference orbit for each spacecraft 101 in the spacecraft formation 109. There is no physical spacecraft 101 associated with the virtual point 111. The virtual point 109 represents a fictitious spacecraft 101 where motion is propagated through time according to a standard nonlinear motion model. From the virtual point 111, relative orbital tracks 107 may be generated that define the nominal locations of each of the spacecraft 101 within the spacecraft formation 109. The virtual point 111 may represent the spacecraft formation 109 to each spacecraft 101, simplifying control calculations. In the depicted embodiment, the virtual point 111 leads the spacecraft formation 109.

Figure 1C:
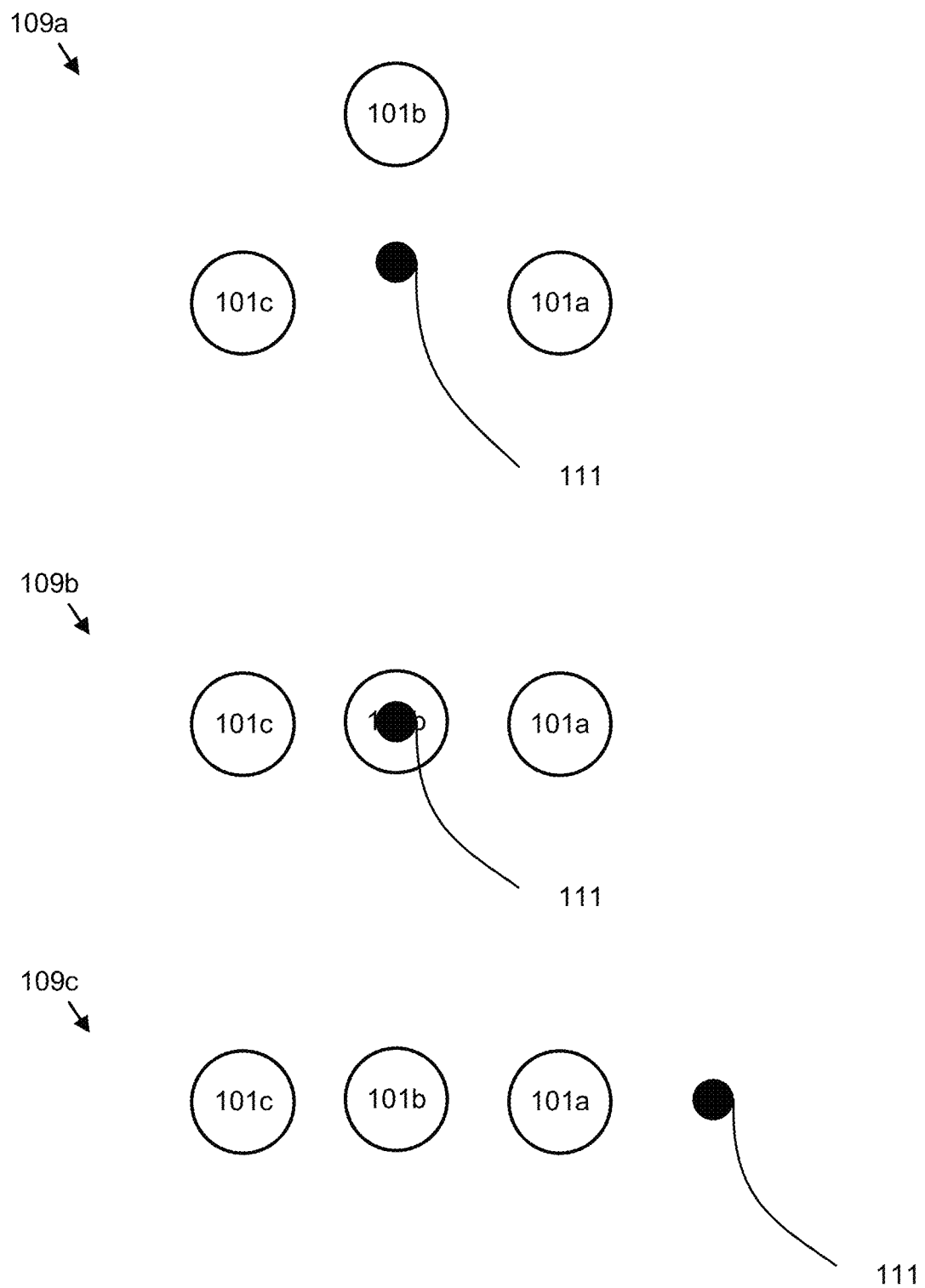
FIG. 1C is a schematic diagram illustrating one embodiment of virtual points.

FIG. 1C is a schematic diagram illustrating one embodiment of virtual points 111 in spacecraft formations 109a-c. The virtual point 111 may be at a center of a spacecraft formation 109 as shown for spacecraft formations 109a/b. The virtual point 111 may be offset from the center including outside the spacecraft formation 109 as shown in spacecraft formation 109c.

Figure 2A:
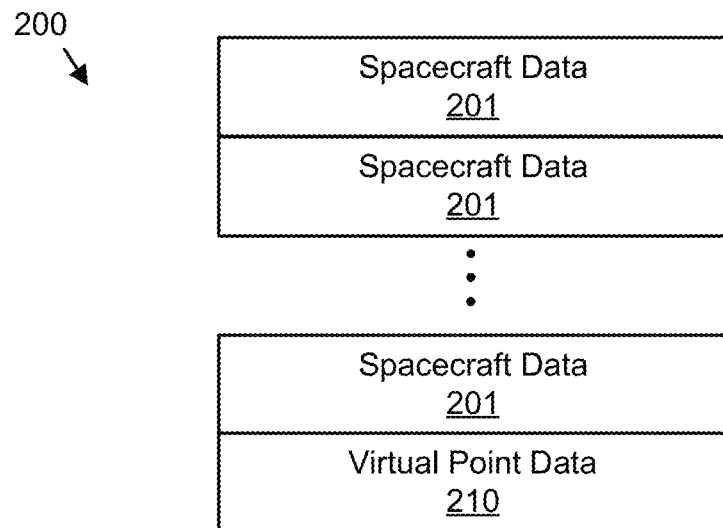
FIG. 2A is a schematic block diagram illustrating one embodiment of formation data.

FIG. 2A is a schematic block diagram illustrating one embodiment of formation data 200. The formation data 200 describes the orbital track 107 of the spacecraft 101 in the spacecraft formation 109. The formation data 200 may be organized as a data structure in a memory. The formation data 200 includes spacecraft data 201 for each spacecraft 101 in the spacecraft formation 109. The spacecraft data 201 is described in more detail in FIG. 2C. In addition, the formation data 200 includes virtual data 210 that describes the orbital track 107 of the virtual point 111.

Figure 2B:
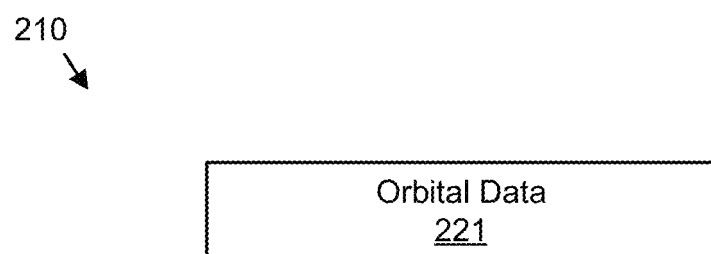
FIG. 2B is a schematic block diagram illustrating one embodiment of virtual point data.

FIG. 2B is a schematic block diagram illustrating one embodiment of the virtual point data 210. In the depicted embodiment, the virtual point data 210 includes orbital data 221. The orbital data 221 may be expressed as Relative Orbital Elements (ROE) and/or Local Vertical Local Horizontal (LVLH) data.

In one embodiment, the orbital data 221 is described using Hill-Chohessey-Whiltshire (HCW) equations as shown in Equation 1. The HCW equations linearize the two-body gravitational dynamic equations about a near circular orbit and can be stated as $$\ddot{x} - 3n_c^2 x - 2n_c \dot{y} = u_x$$

$$\ddot{y} + 2n_c \dot{x} = u_y$$

$$\ddot{z} + n_c^2 z = u_z \qquad (1)$$

where x, y, and z represent the relative position of the spacecraft 101 in Cartesian coordinates in the Local Vertical, Local Horizontal (LVLH) frame; $\dot{x}$, $\dot{y}$, and $\dot{z}$ represent the relative velocities; $\ddot{x}$, $\ddot{y}$, and $\ddot{z}$ represent the relative accelerations; and $n_c$ is the mean motion, or average angular velocity, of the orbital data 221. The LVLH frame may be defined such that x is the radial direction, z is along the angular momentum vector, and y satisfies the right-hand rule.

If the spacecraft state of the virtual point 111 or spacecraft 101 is defined by the spacecraft state comprising a motion vector $x=[x\ y\ z\ \dot{x}\ \dot{y}\ \dot{z}]^T$ and control vector as $u=[u_x u_y u_z]^T$, Equation 1 can be written in the state space form as shown in Equation 2.

$$x = Ax + Bu \qquad (2)$$

where $$A = \begin{bmatrix} 0 & 0 & 0 & 1 & 0 & 0 \\ 0 & 0 & 0 & 0 & 1 & 0 \\ 0 & 0 & 0 & 0 & 0 & 1 \\ 3n_c^2 & 0 & 0 & 0 & 2n_c & 0 \\ 0 & 0 & 0 & -2n_c & 0 & 0 \\ 0 & 0 & -n_c^2 & 0 & 0 & 0 \end{bmatrix} B = \begin{bmatrix} 0 & 0 & 0 \\ 0 & 0 & 0 \\ 0 & 0 & 0 \\ 1 & 0 & 0 \\ 0 & 1 & 0 \\ 0 & 0 & 1 \end{bmatrix}. \qquad (3)$$

If A and B are held constant over some timestep $\Delta t$, an exact discrete solution can be found as shown in Equation 4.

$$x_{k+1} = A_D x_k + B_D u_k,\ A_D = e^{A\Delta t},\ B_D = (\int_0^{\Delta t} e^{A(\Delta t - \tau)} d\tau) B \qquad (4)$$

The resulting discretized HCW matrices are shown in Equations 5 and 6.

$$A_D = \begin{bmatrix} 4 - 3\cos n_c \Delta t & 1 & 0 & \frac{1}{n_c}\sin n_c \Delta t & \frac{2}{n_c}(1 - \cos n_c \Delta t) & 0 \\ 6(\sin n_c \Delta t - n_c \Delta t) & 0 & 0 & \frac{2}{n_c}(\cos n_c \Delta t - 1) & \frac{1}{n_c}(4\sin n_c \Delta t - 3n_c \Delta t) & 0 \\ 0 & 0 & \cos n_c \Delta t & 0 & 0 & \frac{1}{n_c}\sin n_c \Delta t \\ 3n_c \sin n_c \Delta t & 0 & 0 & \cos n_c \Delta t & 2\sin n_c \Delta t & 0 \\ 6n_c(\cos n_c \Delta t - 1) & 0 & 0 & -2\sin n_c \Delta t & 4\cos n_c \Delta t - 3 & 0 \\ 0 & 0 & -n_c \sin n_c \Delta t & 0 & 0 & \cos n_c \Delta t \end{bmatrix} \qquad (5)$$

$$B_D = \begin{bmatrix} \frac{2}{n_c^2}\sin^2\frac{n_c \Delta t}{2} & \frac{-2}{n_c^2}(\sin n_c \Delta t - n_c \Delta t) & 0 \\ \frac{2}{n_c^2}(\sin n_c \Delta t - n_c \Delta t) & \frac{1}{2n_c^2}(8\cos n_c \Delta t + 3n_c^2 \Delta t^2 - 8) & 0 \\ 0 & 0 & \frac{2}{n_c^2}\sin^2\frac{n_c \Delta t}{2} \\ \frac{1}{n_c}\sin n_c \Delta t & \frac{1}{n_c}(2\cos n_c \Delta t - 2) & 0 \\ -\frac{4}{n_c}\sin^2\frac{n_c \Delta t}{2} & \frac{4}{n_c \sin n_c \Delta t - 3\Delta t} & 0 \\ 0 & 0 & \frac{1}{n_c \sin n_c \Delta t} \end{bmatrix} \qquad (6)$$

In one embodiment, $A_D$ matches the discrete transition matrix in Equation 2 while $B_D$ is derived using Equations 3 and 4. In one embodiment, the orbit δα is defined using orbital elements in Equations 7 and 8, where a is a semi-major axis, e is an eccentricity vector of $e_x$ and $e_y$, i is an inclination vector of $i_x$ and $i_y$, Ω is a right ascension of ascending node, w is an argument of perigee, a mean argument of latitude f, mean anomaly M, and c and d subscripts indicate the elements of the chief or reference and deputy or spacecraft orbital paths 107. When the eccentricity and inclination vectors e and i are parallel to each other, the spacecraft 101 does not pass through the relative orbital plane in front of the virtual point 111. In contrast, if the inclination vectors e and i are orthogonal, the spacecraft 101 does pass through the orbital plane in the along track direction raising the risk of collision. The ROE state of the spacecraft 101 is nonsingular for circular orbits ($e_c$=0), whereas it is still singular for strictly equatorial orbits ($i_c$=0).

$$\delta\alpha = \begin{bmatrix} \delta a \\ \delta \lambda \\ \delta e_x \\ \delta e_y \\ \delta i_x \\ \delta i_y \end{bmatrix} = \begin{bmatrix} (a_d - a_c)/a_c \\ (f_d - f_c) + (\Omega_d - \Omega)\cos i_c \\ e_{x,d} - e_{x,c} \\ e_{y,d} - e_{y,c} \\ i_d - i_c \\ (\Omega_d - \Omega_c)\sin i_c \end{bmatrix} \quad (7)$$

where $$\begin{bmatrix} a \\ f \\ e_x \\ e_y \\ i_x \\ \Omega \end{bmatrix} = \begin{bmatrix} a \\ \omega + M \\ e\cos\omega \\ e\sin\omega \\ i \\ \Omega \end{bmatrix} \quad (8)$$

FIG. 2C is a schematic block diagram illustrating one embodiment of the spacecraft data 201. In the depicted embodiment, the spacecraft data 201 includes the spacecraft state 203, a distance threshold 205, an outer polytope boundary 207, an inner polytope boundary 209, a matrix constraint 211, at least one objective function 213, a maneuver strategy 215, a velocity change 217, the MPC 219, the orbital data 221 for the spacecraft 101, a switching strategy 223, a drift horizon 225, ROE data 227, a drift state 241, controller weights 243, a guidance trajectory 245, a simulation 247, a control 249, a switching condition 251, a guidance law 253, model predictive control 255, and fuel consumption 257.

The distance threshold 205 may specify a maximum distance that a given spacecraft 101 may move within the spacecraft formation 109 relative to the virtual point 111. The distance threshold 205 may be a constant. Alternatively, the distance threshold 205 may be dynamically calculated. The distance threshold 205 may be a vector. The drift state 241 may characterize drift.

The controller weights 243 may include weights for control usage R, state error Q, and terminal error P. Table 1 illustrates exemplary controller weights 243.

TABLE 1

| Norm | Weight | Lower Bound | Upper Bound |
| --- | --- | --- | --- |
| $L_1$ | $R_x$ | 0.005 | 0.015 |
| $L_1$ | $R_y$ | 0.005 | 0.015 |
| $L_1$ | $R_z$ | 0.005 | 0.015 |
| $L_1$ | $P_x$ | 5.0 | 15.0 |
| $L_1$ | $P_y$ | 5.0 | 15.0 |
| $L_1$ | $P_z$ | 5.0 | 15.0 |
| $L_1$ | $P_{\dot{x}}$ | 0.5 | 1.5 |
| $L_1$ | $P_{\dot{y}}$ | 0.5 | 1.5 |
| $L_1$ | $P_{\dot{z}}$ | 0.5 | 1.5 |
| $L_2$ | $R_x$ | 0.00005 | 0.00015 |
| $L_2$ | $R_y$ | 0.00005 | 0.00015 |
| $L_2$ | $R_z$ | 0.00005 | 0.00015 |
| $L_2$ | $P_x$ | 5.0 | 15.0 |
| $L_2$ | $P_y$ | 5.0 | 15.0 |
| $L_2$ | $P_z$ | 5.0 | 15.0 |
| $L_2$ | $P_{\dot{x}}$ | 0.05 | 0.15 |
| $L_2$ | $P_{\dot{y}}$ | 0.05 | 0.15 |
| $L_2$ | $P_{\dot{z}}$ | 0.05 | 0.15 |
| $L_\infty$ | $R_x$ | 0.005 | 0.015 |
| $L_\infty$ | $R_y$ | 0.005 | 0.015 |
| $L_\infty$ | $R_z$ | 0.005 | 0.015 |
| $L_\infty$ | $P_x$ | 5.0 | 15.0 |
| $L_\infty$ | $P_y$ | 5.0 | 15.0 |
| $L_\infty$ | $P_z$ | 5.0 | 15.0 |
| $L_\infty$ | $P_{\dot{x}}$ | 0.5 | 1.5 |
| $L_\infty$ | $P_{\dot{y}}$ | 0.5 | 1.5 |
| $L_\infty$ | $P_{\dot{z}}$ | 0.5 | 1.5 |

The MPC 219 may employ model predictive control 255 find the most fuel-efficient strategy to perform an in-space maneuver for the spacecraft 101 to minimize fuel consumption 257 by the spacecraft 101. The basis for these dynamic optimization problems is a dynamic model that describes how the spacecraft state x(k) 203 changes with time, assuming an initial condition x(0), that is affected by the control input u(k) of a control vector u as shown in Equation 9. The control input and/or control vector u may implement a guidance law 253.

$$x(k+1) = g(x(k), u(k)), \quad x(0) = x_0, \quad (9)$$

where g(x,u) generally represents a nonlinear function. The goal of the optimal control procedure is to find the vector of inputs $U_N = [u(0)^T, \ldots, u(N-1)^T]^T$ such that the objective function is optimized over the time horizon N. The MPC 219 may be solved as shown in Equation 10.

$$\min_{U_N} \sum_{k=0}^{N-1} q(x_k, u_k) + p(x_n) \quad (10)$$

$$\text{s.t.} \quad x_{k+1} = g(x(k), u(k)), \quad x(0) = x_0 \quad k = 1, 2, , N$$

$$u_k \in U, \quad x_k \in X \quad k = 0, 1, 2, , N-1$$

The terms q(x,u) and p(x) represent the stage cost and the terminal cost, respectively. Stage cost is the transitory cost along the maneuver. Terminal cost is a cost for the final maneuver. In the past, two problems often occurred when using an optimal control solution in practice. First, even with optimization algorithms taking advantage of linearities and convexities, a horizon time that is sufficiently large enough to produce desirable convergence characteristics may prove computationally prohibitive. Second, the model of the spacecraft 101 is usually inaccurate and the spacecraft 101 may be impacted by external disturbances that can cause it to diverge from the predicted path. For this reason, in the embodiments, the spacecraft state 203 may be measured at a future time period and the optimal control problem is resolved, where the measured spacecraft state x(1) 203 is considered the new initial condition. This process is embodied in the MPC 219.

Since the linearized model dynamics may not match the true dynamics or account for perturbations, the first control found u0 is applied to the spacecraft 101 and response is measured. This new state x(1) can then be considered a new initial condition and the MPC 219 can be run again to find an updated control scheme. This allows for the system to react and correct perturbations without perfect knowledge of the spacecraft system. Another advantage of MPC 219 is that constraints can be added to bound the spacecraft states 203 or control inputs which is not possible with other feedback controllers such as linear quadratic control. Finally, the MPC time horizon allows it to preemptively act to stay within the bounds rather than simply react which can allow for more judicious control usage.

The MPC 219 provides the ability to express constraints, which is not common in many feedback control solutions. Furthermore, weights in the objective functions 213 can provide intuitive "control knobs" for tuning to the desired behavior.

The guidance trajectory 245 may be a vector along which the maneuver the spacecraft 101. The guidance trajectory 245 may be calculated to maintain a desired separation distance between a given spacecraft and a virtual point 111 and/or lead spacecraft 101. The simulation 247 may estimate the effects of a guidance trajectory 245. The control 249 may indicate whether a spacecraft 101 will be maneuvered.

Common objective functions 213 for linear systems include the $L_2$, $L_1$, and $L_\infty$ norms as they can result in quadratic and linear programs. Given an initial spacecraft state of $x_0$ 203, and a time horizon of N intervals, the $L_2$, or quadratic, objective function 213b can be written as shown in Equation 11 subject to Equation 12.

$$J(x, u) = \frac{1}{2}u_0^T R u_0 + \frac{1}{2}\sum_{k=1}^{N-1}\left[x_k^T Q x_k + u_k^T R u_k\right] + \frac{1}{2}x_N^T P x_N \quad (11)$$

$$x_{k+1} = A x_k + B u_k \quad (12)$$

where R, Q, and P are the weightings on control usage, state error, and terminal error, respectively. For a linear system, the spacecraft dynamics become $x_{k+1}=Ax_k+Bu_k$. The $L_1$ and $L_\infty$ objective functions 213 are shown in Equations 13 and 14 respectively.

$$J_1 = \Sigma_{k=1}^{N-1}|Qx_k|_1 + \Sigma_{k=0}^{N-1}|Ru_k|_1 + |Px_N|_1 \quad (13)$$

$$J_\infty = \Sigma_{k=1}^{N-1}|Qx_k|_\infty + \Sigma_{k=0}^{N-1}|Ru_k|_\infty + |Px_N|_\infty. \quad (14)$$

Velocity change (ΔV) 217 may be used as the metric to compare the fuel savings of the different norms. The three different object function norms 213 may be compared in terms of requisite computation time and total velocity change ΔV 217.

To maintain a given spacecraft formation 109, the outer polytope boundary 207, the inner polytope boundary 209, and the drift horizon 225 are defined to force the spacecraft 101 to stay within a keep-in-boundary. This allows the spacecraft 101 to drift while also maintaining the given spacecraft 101 in the required position within the spacecraft formation 109. At each timestep k the outer polytope boundary 207 and the inner polytope boundary 209 are defined by a convex polytope consisting of a plurality faces where the position elements of the desired spacecraft state $X_{d,k}$ 203 of the spacecraft 101 exist within the polytope volume. The use of a convex polytope allows for a high degree of freedom in the possible constraints and for the formulation of the problem as a linear program. Each of the polytope faces are defined by a point p and a normal vector $\hat{\eta}$ that is assumed to point towards the interior of the outer polytope boundary 207 and/or the inner polytope boundary 209. Let r be any arbitrary point. If r is on the boarder or interior of the outer polytope boundary 207 and/or the inner polytope boundary 209 then the dot product will satisfy Equation 15.

$$\hat{\eta} \cdot (r-p) \geq 0 \text{ or, equivalently, } -\hat{\eta}^T r \leq -\hat{\eta}^T p. \quad (15)$$

The matrix constraint 211 may be used to force the spacecraft state $x_k$, 203 consisting of three position and three velocity elements, to be within the outer polytope boundary 207 and/or the inner polytope boundary 209 defined at time k. This is formulated as Equation 16 and 17.

$$A_{poly,k} x_k \leq b_{poly,k} \quad (16)$$

where $$A_{poly,k} = \begin{bmatrix} -\hat{\eta}_{1,k}^T & 0_{1\times 3} \\ -\hat{\eta}_{2,k}^T & 0_{1\times 3} \\ \vdots & \vdots \\ -\hat{\eta}_{M,k}^T & 0_{1\times 3} \end{bmatrix} b_{poly,k} = \begin{bmatrix} -\hat{\eta}_{1,k}^T p_{1,k} \\ -\hat{\eta}_{2,k}^T p_{2,k} \\ \vdots \\ -\hat{\eta}_{M,k}^T p_{M,k} \end{bmatrix} \quad (17)$$

with $\hat{\eta}_{i,k}$ and $p_{i,k}$ being the normal and point associated with the ith face of the polytope at time k. This implements a zero-padded version of Equation 16 which allows the constraint to ignore the velocity.

The outer polytope boundary 207 and/or the inner polytope boundary 209 may be a close approximation of a sphere, an ROE polytope, a six-sided box and/or a pyramid. A spherical polytope approximation may be done by selecting points from a spherical surface such as in FIG. 3A and using the points for the vertices of the polytope. The convex hull formed by these points is then found and each face is used as a polytope face. At each simulation step, the polytope boundary 207/209 is formed by adding the points $p_{i,k}$ to each position along the desired trajectory of the spacecraft 101. Additional polytope boundaries 207/209 are shown in FIGS. 3E and 3H.

The embodiments implement the MPC 219 to calculate the optimal control sequence for the case when the spacecraft 101 exits a polytope boundary 207/209. As used herein, exits refers to reaches, exits, and/or will exit polytope boundary 207/209 within a specified time interval. The embodiments may implement $L_1$, $L_2$, and/or $L_\infty$ norm objective functions 213 with the goal of comparing the fuel savings. Exemplary objective functions 213 are described hereafter.

If it is desired that the spacecraft state x 203, tracks a desired trajectory, $x_d$, then the error state $x_e = x - x_d$ is driven to zero, and the objective function 213 may be updated to account for this. In one embodiment, the desired trajectory is the desired relative state 203 of each spacecraft 101 and is initialized using ROE and converted to the LVLH frame. The desired spacecraft state 203 for each spacecraft 101 is updated using the HCW equations.

Using the desired state, the $L_2$ objective function 213b can be written as Equation 18.

$$J(x, u) = \frac{1}{2}u_0^T R u_0 + \frac{1}{2}\sum_{k=1}^{N-1}\left[x_{e,k}^T - 2x_{d,k}^T Q x_{e,k} + u_k^T R u_k\right] + \frac{1}{2}x_{e,N}^T P x_{e,N}. \quad (18)$$

The optimization problem with the polytope constraint can be written as Equation 19.

$$\min_{x,u} \quad \frac{1}{2}u_0^T R u_0 + \qquad (19)$$

$$\frac{1}{2}\sum_{k=1}^{N-1}\left[x_k^T Q x_{e,k} - 2x_{d,k}^T Q x_{e,k} + u_k^T R u_k + \right.$$

$$\left.\frac{1}{2}(x_{e,N}^T P x_{e,N} - 2x_{d,N}^T P x_{e,N})\right]$$

s.t.
$x_{k+1} = A_D x_k + B_D u_k$     $k = 0, 1, , N-1$ $A_{poly,k} x_k \leq b_{poly,k}$     $k = 1, 2, , N$ $u_k \leq 1 u_{max}$     $k = 0, 1, 2, , N-1$ $u_k \geq 1 u_{max}$     $k = 0, 1, 2, , N-1$ The constraints ensure the dynamics are followed, keep the spacecraft 101 within the outer polytope boundary 207 and/or inner polytope boundary 209, and limit the maximum and minimum control accelerations.

The $L_1$ objective function 213a with $x_e$ may be Equation 20.

$$j_1 = \Sigma_{k=1}^{N-1}|Qx_{e,k}|_1 + \Sigma_{k=0}^{N-1}|Ru_k|_1 + |Px_{e,N}|_1. \qquad (20)$$

The full optimization formulation with the polytope constraint for the $L_1$ objective function 213b may then be given by Equation 21.

$$\min_{x,u} \quad \sum_{k=1}^{N-1}|Qx_{e,k}|_1 + \sum_{k=0}^{N-1}|Ru_k|_1 + |Px_{e,N}|_1 \qquad (21)$$

s.t.
$x_{k+1} = A_D x_k + B_D u_k$     $k = 0, 1, , N-1$ $A_{poly,k} x_k \leq b_{poly,k}$     $k = 1, 2, , N$ $u_k \leq 1 u_{max}$     $k = 0, 1, 2, , N-1$ $u_k \geq 1 u_{max}$     $k = 0, 1, 2, , N-1$ The $L_\infty$ norm objective function 213c with $x_e$ may be written as Equation 22.

$$J_\infty = \Sigma_{k=1}^{N-1}|Qx_{e,k}|_\infty + \Sigma_{k=0}^{N-1}|Ru_k|_\infty + |Px_{e,N}|_\infty. \qquad (22)$$

The full optimization formulation with the polytope constraint for the $L_\infty$ objective function norm 213c is then Equation 23.

$$\min_{x,u} \quad \sum_{k=1}^{N-1}|Qx_{e,k}|_\infty + \sum_{k=0}^{N-1}|Ru_k|_\infty + |Px_{e,N}|_\infty \qquad (23)$$

s.t.
$x_{k+1} = A_D x_k + B_D u_k$     $k = 0, 1, , N-1$ $A_{poly,k} x_k \leq b_{poly,k}$     $k = 1, 2, , N$ $u_k \leq 1 u_{max}$     $k = 0, 1, 2, , N-1$ $u_k \geq 1 u_{max}$     $k = 0, 1, 2, , N-1$ In one embodiment, the objective function 213d is employed based on Equation 24, wherein R is a control usage weight, Q is a state error weight, and P is a terminal error weight.

$$J(x,u)_p = \|u_0\|_{R,p} + \Sigma_{k=1}^{N-1}[\|x_k\|_{Q,p} + \|u_k\|_{R,p}] + \|x_N\|_{P,p} \qquad (24)$$

As the control usage weighting R is increased, the spacecraft 101 is controlled more frequently. As the state error weight Q is increased, the spacecraft 101 is maneuvered closer to a desired trajectory. The maneuver strategy 215 is described in FIGS. 3B-C and 3I-J. The switching strategy 223 and drift horizon 225 are described in FIG. 3D. The switching strategy 223 may be subject to a switching condition 251. The ROE data is described in FIG. 2D.

Figure 2D:
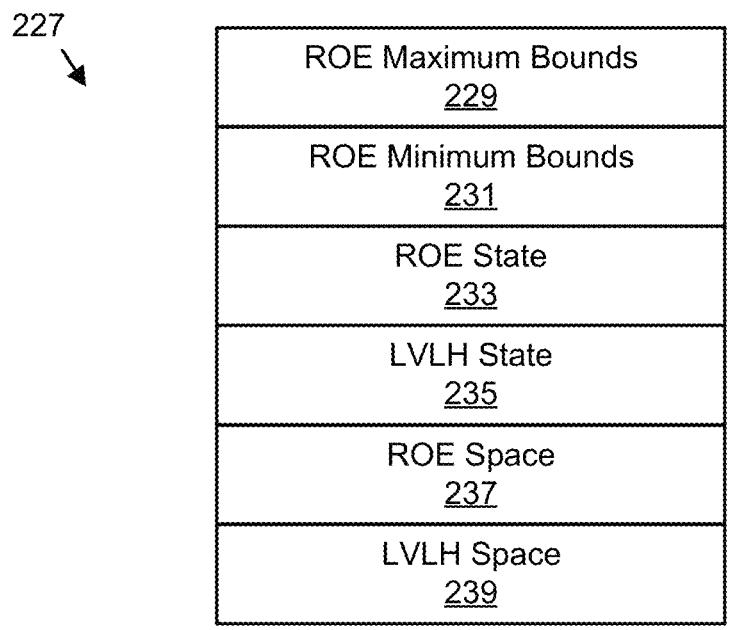
FIG. 2D is a schematic block diagram illustrating one embodiment of Relative Orbital Elements (ROE) data.

FIG. 2D is a schematic block diagram illustrating one embodiment of ROE data 227. In the depicted embodiment, the ROE data 227 includes ROE maximum bounds 229, ROE minimum bounds 231, at least one ROE state 233, at least one corresponding LVLH state 235, a ROE space 237, and a LVLH space 239. The ROE state $a_i$ 233 includes a plurality of ROE elements $\delta a$, $\delta \lambda$, $\delta e_x$, $\delta e_y$, $\delta i_x$, $\delta i_y$. The ROE space 237 and/or LVLH space 239 may be defined by an outer polytope boundary 207 and/or an inner polytope boundary 209 including an ROE-based polytope as will be described hereafter in FIG. 3E.

Figure 3A:
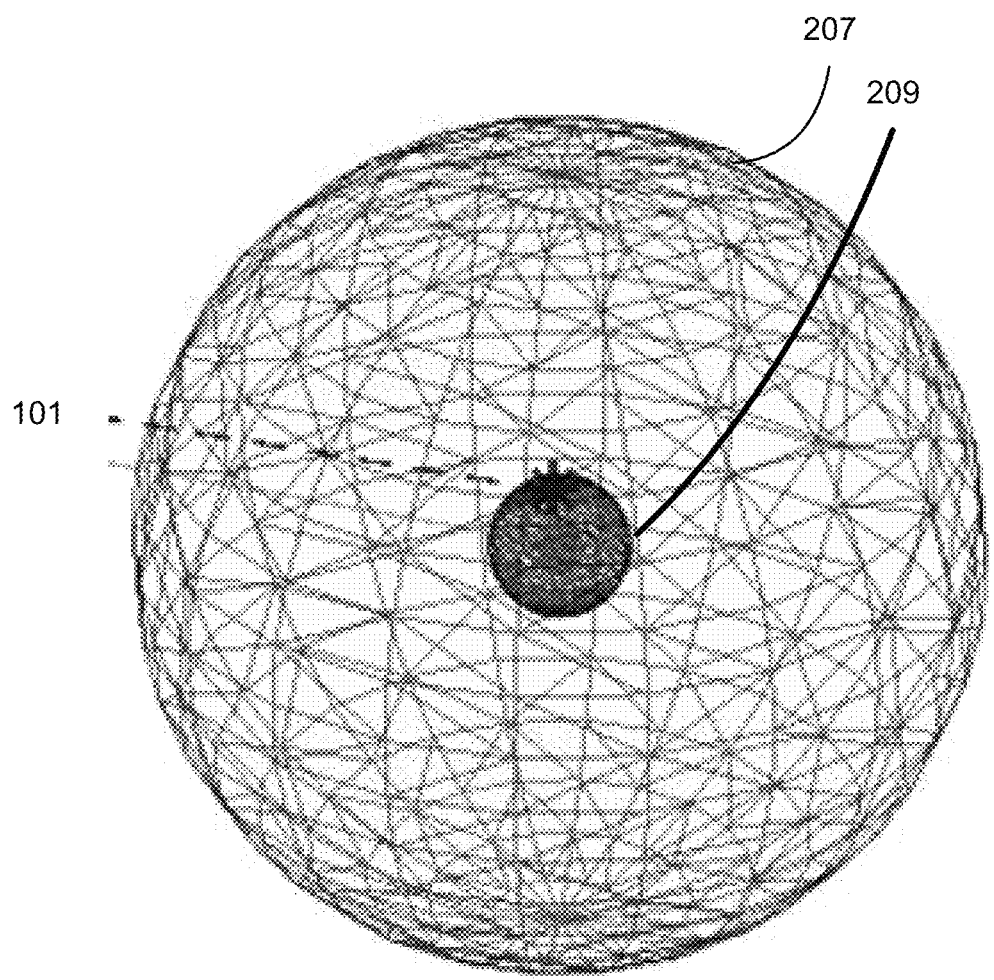
FIG. 3A is a drawing illustrating one embodiment of outer and inner polytope boundaries.

FIG. 3A is a drawing illustrating one embodiment of the outer polytope boundary 207 and the inner polytope boundaries 209. The outer polytope boundary 207 and the inner polytope boundaries 209 are employed to maintain a position of a spacecraft 101 relative to the virtual point 111. By individually maintaining the position of each spacecraft 101 relative to the virtual point 111, the positions of all spacecraft 101 within the spacecraft formation 109 are maintained. In one embodiment, no outer polytope boundaries 207 of the plurality of spacecraft 101 overlap.

In the depicted embodiment, the polytopes 207/209 are sphere-based polytopes. For the sphere-based polytope, a number of points are selected on the surface of a sphere with a radius of a specified length. The points chosen are those which result from the crossing of evenly dispersed lines of latitude and longitude.

Figure 3B:
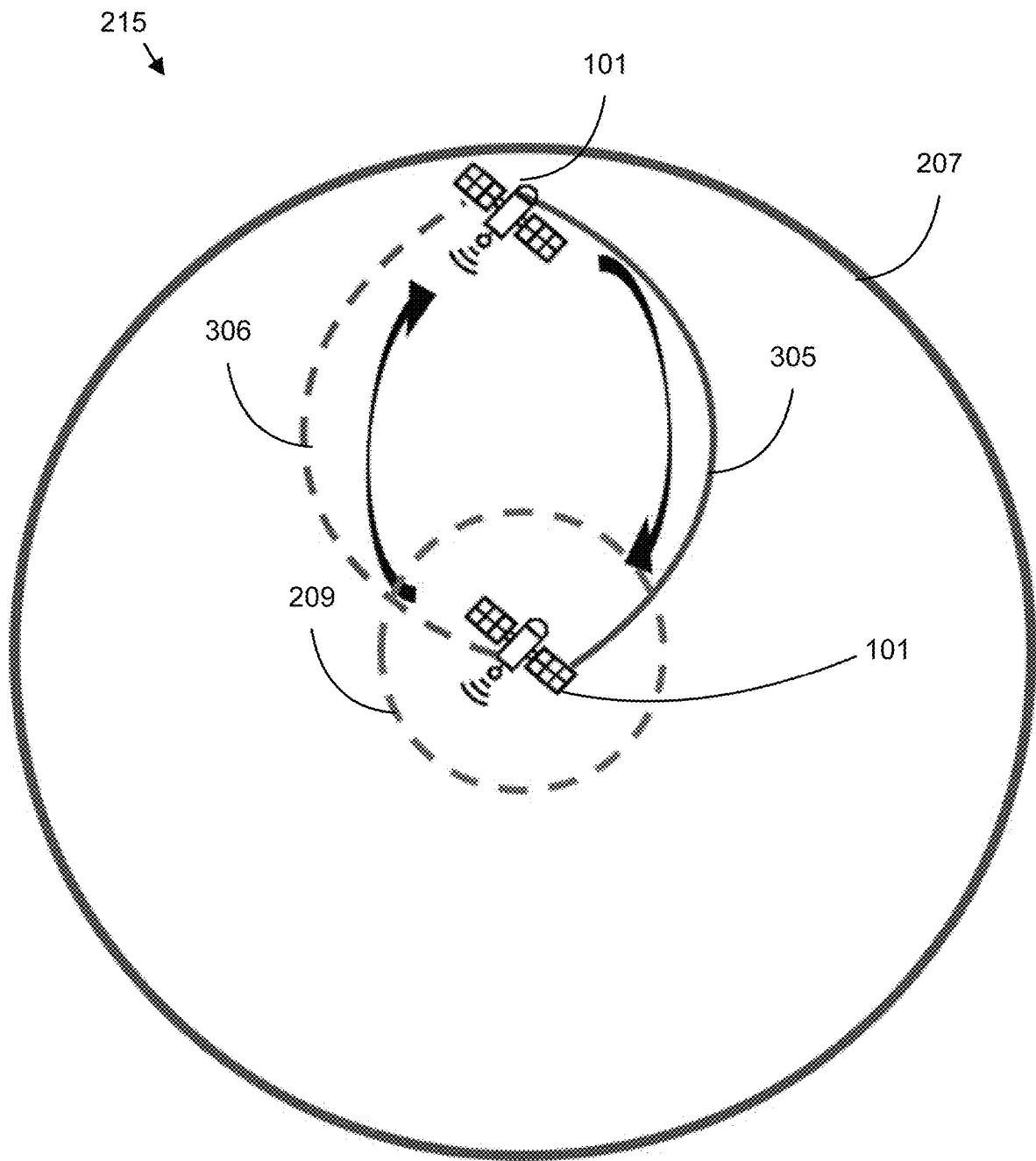
FIG. 3B is a drawing illustrating one embodiment of a large maneuver strategy.

FIG. 3B is a drawing illustrating one embodiment of a large maneuver strategy 215 maneuver strategy 215. As shown, a spacecraft 101 has drifted 306 outside of the inner polytope boundary 209 and may exit the outer polytope boundary 207. In the depicted maneuver strategy 215, fewer maneuvers 305 are used to control a spacecraft 101 to within and/or to the center of the outer polytope boundary 207 and/or inner polytope boundary 209. The large maneuver strategy 215 may comprise no more than a maneuver threshold of maneuvers 305 to move the spacecraft 101 within the outer polytope boundary 207 and/or inner polytope boundary 209. The maneuver threshold may be in the range of 2 to 20 maneuvers 305.

Figure 3C:
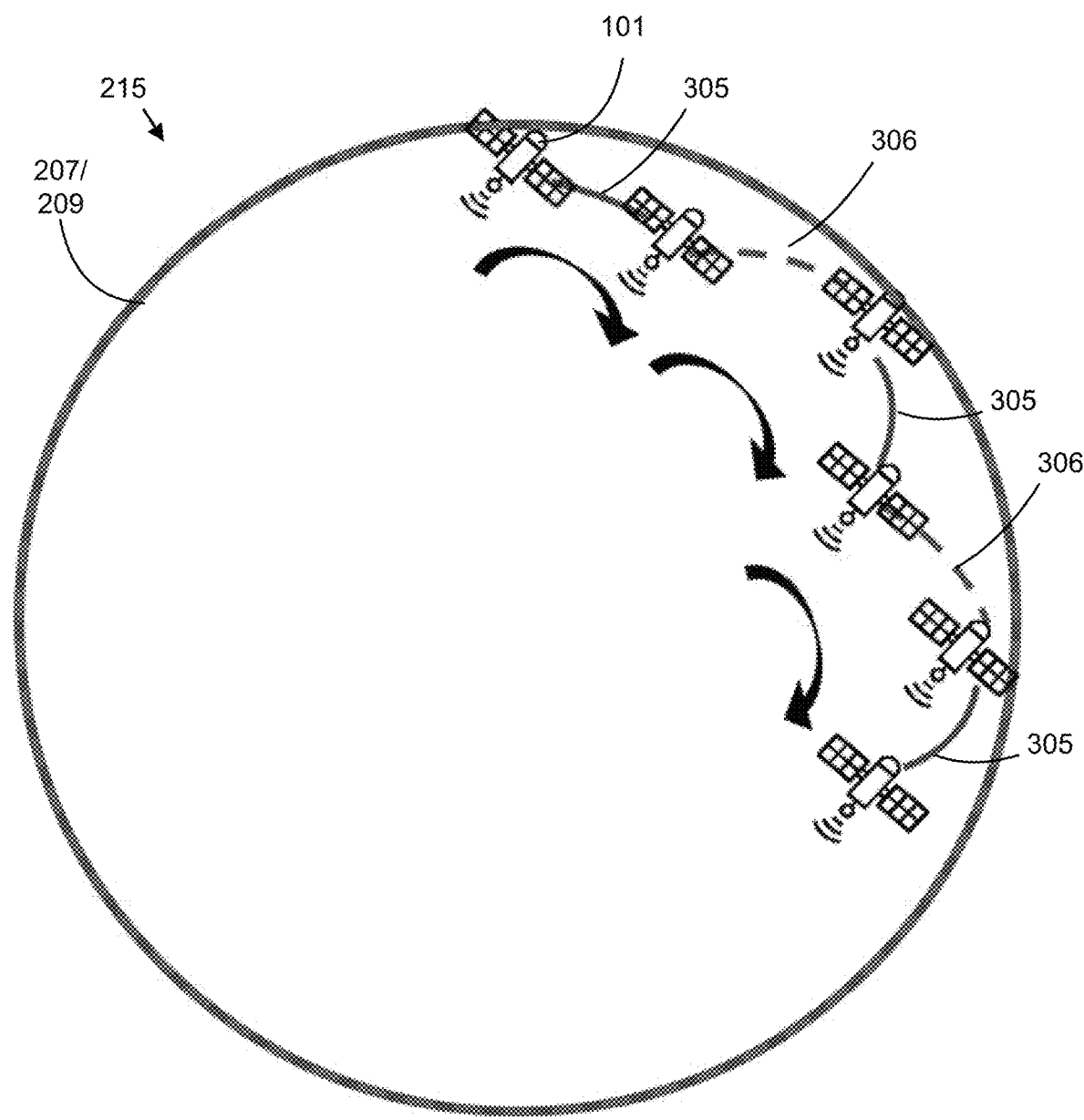
FIG. 3C is a drawing illustrating one embodiment of a small maneuver strategy.

FIG. 3C is a drawing illustrating one embodiment of a small maneuver strategy 215 maneuver strategy 215. The spacecraft 101 is shown drifting 306 to exit the outer polytope boundary 207. In the depicted embodiment, the outer polytope boundary 207 and the inner polytope boundary 209 have a same radius. For the small maneuver strategy 215 maneuver strategy 215, more maneuvers 305 are used to control a spacecraft 101 within the outer polytope boundary 207 and/or inner polytope boundary 209. The small maneuver strategy 215 may comprise at least the maneuver threshold of maneuvers 305 to move the spacecraft 101 within the inner polytope boundary 209.

The embodiments may employ the large maneuver strategy 215 and the small maneuver strategy 215 to minimize fuel usage. The large maneuver strategy 215 periodically uses large maneuvers 305 to drive the position and velocity error to near zero. The small maneuver strategy 215 uses many small maneuvers 305 to stay just inside the boundary of the outer polytope boundary 207 and/or inner polytope boundary 209.

Figure 3D:
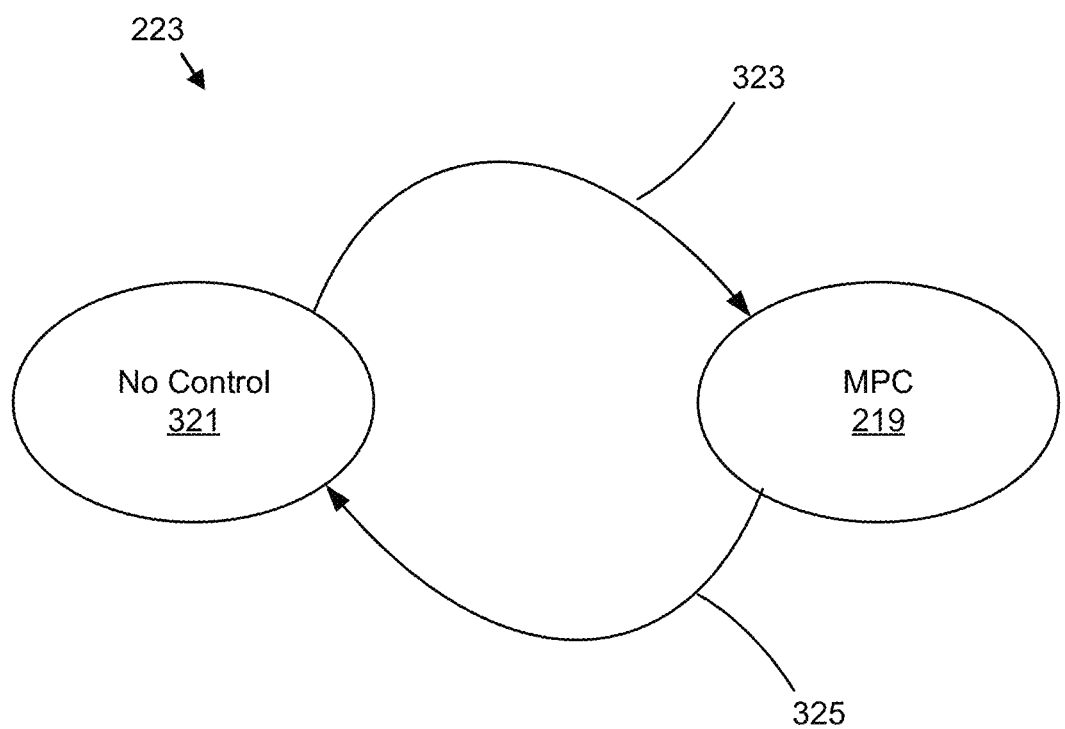
FIG. 3D is a drawing illustrating one embodiment of a switching strategy.
Figure 3E:
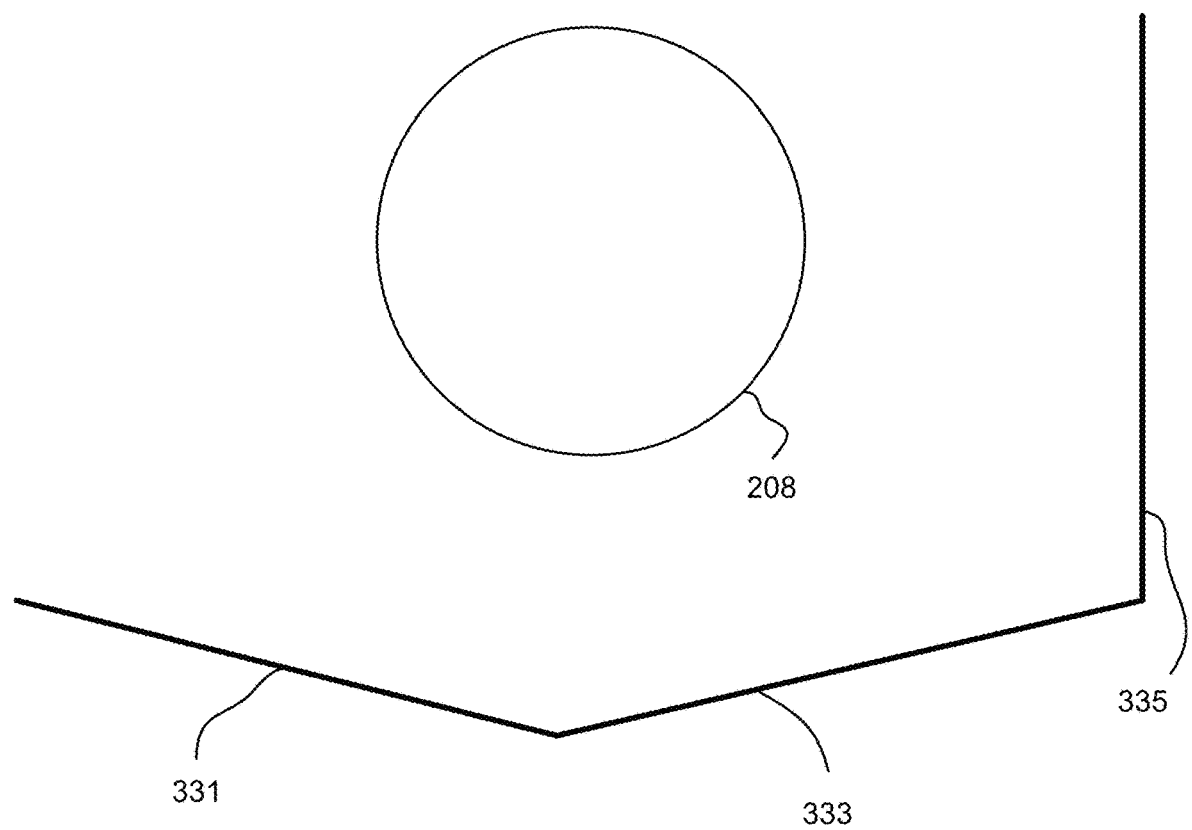
FIG. 3E is a drawing illustrating one embodiment of a convex polytope.

FIG. 3D is a drawing illustrating one embodiment of the switching strategy 223. The switching strategy 223 may determine when to employ the MPC 219 to allow the spacecraft 101 to coast or drift. The switching conditions 323/325 may be the outer polytope boundary 207. The outer polytope boundary 207 may be a keep-in-boundary. In one embodiment, if a maneuver switching condition 323 determines that the spacecraft 101 will leave the keep-in-boundary then the MPC 219 is activated. If a drift switching condition 325 determines that the spacecraft 101 will remain within the keep-in-boundary, the MPC 219 is deactivated and no control 321 is employed.

In the embodiment of FIG. 3C, the inner polytope boundary 209 is set to have the same radius as the outer polytope boundary 207. This causes the MPC 219 to only be on long enough to keep the spacecraft 101 just inside the outer polytope boundary 207. The outer polytope boundary 207 and the inner polytope boundary 209 are depicted in FIGS. 3A-C.

The inner polytope boundary 209 may be used in the design of the weighting matrix Q. This may encourage the spacecraft 101 to stay in the inner polytope boundary 209. The weighting matrices Q and R may be chosen using Equations 25 and 26.

$$Q_{ij} = \begin{cases} \frac{1}{z_{i,max}^2} & i = j \\ 0 & i \neq j \end{cases} \quad i, j \in 1, \ldots, \ell \quad (25)$$

$$R_{ij} = \begin{cases} \frac{1}{u_{i,max}^2} & i = j \\ 0 & i \neq j \end{cases} \quad i, j \in 1, \ldots, k \quad (26)$$

where $z_{i,max}$ is the maximum desired deviation for the $i^{th}$ state element and $u_{i,max}$ is the maximum desired control for the $i^{th}$ control element. This effectively normalizes or non-dimensionalizes the optimization problem so that the states and controls are equally balanced. The choice of Q and R guide, but do not constrain, the evolution of the state error and control usage and without other constraints there is no guarantee that the $z_{i,max}$ and $u_{i,max}$ values will not be exceeded.

Given Q, and R, the terminal cost, P, of the system can be designed to ensure asymptotic stability of the MPC 219. To guarantee stability, the terminal cost is chosen to represent the cost-to-go of the unconstrained infinite horizon problem for the $L_2$ norm. The Discrete-time Algebraic Riccati Equation (DARE) can be used to find the cost-to-go, $X^T P_\infty X$, or the unconstrained infinite horizon problem. The DARE is represented as shown in Equation 27, wherein A and B are controllable, R is positive definite, Q is positive, semi-definite, and completely observable.

$$0 = A'P_\infty A - P_\infty + Q - A'P_\infty B(B'P_\infty B + R)^{-1}B'P_\infty A. \quad (27)$$

In one embodiment, the objective function 213d of Equation 24 is used. The $P_\infty$ found solving the DARE is then used as the matrix in the terminal cost, P, in the objective function, Equation 15. This guarantees asymptotic stability of the system for the L 2 norm objective function 213. In one embodiment A and B may be completely controllable, which is true for the HCW system. R may be positive definite, and Q may be positive semi-definite and completely observable.

In one embodiment, the terminal error weighting $P_\infty$ is chosen to represent a cost-to-go of an unconstrained infinite horizon problem for an $L_2$ norm. The DARE Equation 27 may be used to calculate the cost-to-go, $X^T P_\infty X$.

DARE may be solved for P, and P used as the matrix in the terminal cost, P, in Equation 24. So constrained, the embodiment may provide asymptotic stability for the spacecraft 101 for the $L_2$ norm formulation. For $L_1$ and $L_\infty$, if the exact discrete system is asymptotically stable, then $X_f$ may be chosen as a positively invariant set of the system of Equation 28.

$$x(k+1) = Ax(k) \text{ s.t. } x \in X \quad (28)$$

Therefore, the input 0 is feasible in $X_f$ and the Lyapunov inequality for the $L_\infty$ and $L_1$ cases is given by Equation 29, where p=1 or p=∞ for the $L_1$ and $L_\infty$ norms, respectively.

$$-\|Px\|_p + \|PAx\|_p + \|Qx\|_p \leq 0 \; \forall x \in X_f \quad (29)$$

Equation 29 may be satisfied if a P is chosen that satisfies the Lyapunov function for the $L_1$ and $L_\infty$ cases. In one embodiment, the Pp found solving Equation 29 is then used in the objective function. This may guarantee asymptotic stability of the system.

In one embodiment, if $X_f$ can be computed, $X_f$ may be used as the terminal constraint. Equation 30 may be satisfied by the infinite time unconstrained optimal cost matrix in Equation 31, wherein Equation 31 represents the optimal infinite horizon cost function.

$$u \in U, \min_{Ax + Bu \in X_f} (-p(x) + q(x, u) + p(Ax + Bu)) \leq 0, \; \forall \, x \in X_f \quad (30)$$

$$J_\infty^*(x(0)) = \|P_\infty x(0)\|_\infty \quad (31)$$

To determine if the spacecraft 101 will exit the outer polytope boundary 207, the drift horizon $N_{drift}$ 225 may be used. The spacecraft state x 203 is propagated using the discrete form of the HCW equations orbital data 221 as Equation 32.

$$\hat{x}_{k+1} = A_D \hat{x}_k \; k = 0, N_{drift} - 1 \quad (32)$$

where $x_0$ is the current state 203 of the spacecraft 101 and $\hat{x}_k$ are the projected spacecraft states 203 of the spacecraft 101 while drifting. Since this propagation is used to determine the behavior of the spacecraft 101 once the controls are turned off, no control inputs are used.

At each timestep along the drift horizon 225, the outer polytope boundary 207 centered on the desired trajectory at that time is determined. Assuming that $\hat{p}_i$ is the ith point of the outer polytope boundary 207 and is defined with axes identical to the LVLH frame but centered on the desired position of the spacecraft 101, then $p_{i,k}$ is calculated using Equation 33.

$$p_{i,k} = \hat{p}_i + x_{d,k} \; \forall i \in M, \; k = 0, N_{drift} \quad (33)$$

where M is the number of points used to define the polytope boundary 207/209, $x_{d,k}$ is the $k^{th}$ state along the desired orbital path 107, and $p_{i,k}$ is used to define the polytope inequalities.

The drift states $\hat{x}$ 241 may be compared against the polytope using Equation 34, which is identical in form to how the polytope volume is used in the MPC 219 but the time horizon $N_{drift}$ may not be identical to the MPC horizon $N_{MPC}$.

$$A_{poly,k} \hat{x}_k \leq b_{poly,k} \; k = 0, 1, N_{drift} \quad (34)$$

If Equation 29 holds for all k along the drift horizon 225, then the spacecraft 101 is projected to remain inside the outer polytope boundary 207 and the control is not needed. However, if there is any k where the equation does not hold, then the spacecraft 101 is projected to drift out of the outer polytope boundary 207. The MPC 219 then turns on and maneuvers the spacecraft 101. Once the MPC 219 turns on, the spacecraft 101 continues to recalculate and implement controls each timestep until the drift switching condition 325 is met.

The inner polytope boundary 209 may be used to determine if a drift switching condition 325 is satisfied, turning MPC 219 off. The inner polytope boundary 209 may also be defined in the LVLH frame centered on the desired orbital path 107 and is translated as shown in Equation 35.

$$p_{i,k}' = \hat{p}_i' + x_{d,k} \quad \forall i \in M', \; k=0, N_{drift} \tag{35}$$

where the prime indicates that the point is on the inner polytope boundary 209. The drift states 241 are then checked against the inner polytope and if Equation 30 holds true over the entire drift horizon 225, the positional requirement of the spacecraft 101 is considered to be met. The inner polytope boundary radius may also be used to set the Q weight on desired position deviation as shown in Equation 36.

$$A_{poly,k}' \hat{x}_k \leq b_{poly,k}' \quad k=0,1,N_{drift} \tag{36}$$

In one embodiment, a velocity check is also implemented that compares the velocity of the spacecraft 101 at each point along the drift trajectory with the desired orbital track 107. The cutoff condition is defined using Equation 37.

$$|v - v_d|_2 \leq \delta v \tag{37}$$

where v is the current velocity, $v_d$ is the desired velocity, and $\delta v$ is the allowable velocity error. The MPC 219 turns off if both the inner polytope boundary 209 and the velocity condition are met. The purpose of the velocity switching condition is to guide the spacecraft 101 to better match the desired orbital track 107 without having to drastically tighten the inner polytope boundary 209.

FIG. 3E is a drawing of an ROE-based polytope 208. The outer polytope boundary 207 may be an ROE-based polytope 208. In addition, the inner polytope boundary 209 and/or drift horizon 225 may also be an ROE-based polytope 208. The ROE-based polytope 208 is shown as a sphere along a radial axis 331, an along orbital track axis 333, and a cross orbital track axis 335. The ROE-based polytope 208 may change in shape over time.

Given an initial LVLH state $x_i$ of a spacecraft 101, the ROE-based polytope 208 is defined in the following manner. Using the virtual point's 111 state as a reference, the LVLH state is converted to an ROE representation $\delta\alpha_i$. Each ROE element is bounded by some $\sigma \in \{\sigma_-, \sigma_+\}$ which represents the allowable positive and negative deviations from the nominal spacecraft state 203. Every combination of maximum ROE bounds 229 and minimum ROE bounds 231 for each ROE element is shown in Equation 38.

$$\sigma_i \in \begin{Bmatrix} \sigma_{\delta a,-}, \; \sigma_{\delta a,max} \\ \sigma_{\delta \lambda,-}, \; \sigma_{\delta \lambda,+} \\ \sigma_{\delta e_x,-}, \; \sigma_{\delta e_x,+} \\ \sigma_{\delta e_y,-}, \; \sigma_{\delta e_y,+} \\ \sigma_{\delta i_x,-}, \; \sigma_{\delta i_x,+} \\ \sigma_{\delta i_y,-}, \; \sigma_{\delta i_y,+} \end{Bmatrix} \tag{38}$$

The maximum and minimum bounds are added to the nominal ROE state 233 of Equation 39.

$$\delta\alpha_i = \begin{bmatrix} \delta a \\ \delta \lambda \\ \delta e_x \\ \delta e_y \\ \delta i_x \\ \delta i_y \end{bmatrix} + \sigma_i \tag{39}$$

This results in 64 different ROE states 233 that represent the allowable bounds in ROE space 237. Each of these are then converted to Cartesian coordinates in the LVLH frame, again using the virtual point 111 as a reference, generating a cloud of states centered on the nominal ROE state 233. The convex hull of the positions of all the points is then found and used as the ROE polytope 208. The conversion of the constraints from ROE space 237 to LVLH space 239 may cause minor deviations in the constraints.

When multiple ROE-based polytopes 208 are desired along an orbital track 107, the point cloud is found in LVLH space 239. Then, instead of dropping the velocity terms, each point is propagated forward the desired number of steps, using HCW equations. At each point along the orbital track 107, there is now a cloud of points that can be converted to ROE-based polytopes 208 by the preceding method where the convex hull of positions is found. The ROE polytope 208 also could be computed by propagating the ROEs and then converting to LVLH states 235. This would also require propagating reference ROE states 233 which are needed for the conversion. By propagating the ROE-based polytope 208 in LVLH space, only one set of ROE states 233 needs to be propagated and no additional conversions are required.

The outer polytope boundary 207, regardless of shape, only constrains a spacecraft's position in the LVLH space 239. However, when the spacecraft's trajectory is compared against a series of ROE-based polytopes 208, there is an implicit constraint on the velocity since the spacecraft 101 cannot move in such a way that it would breach the position constraints in the future. While each ROE state 233 corresponds to a full LVLH state 235 with position and velocity, the velocity portions are ignored when developing the ROE-based polytope 208. The spacecraft position may exist within the ROE-based polytope 208 position constraint, but the spacecraft velocity may mean that original boundaries, defined in the ROE space 237, are being breached. This should only be a transitory event since the sequence of position constraints approximates a velocity bound.

Figure 3F:
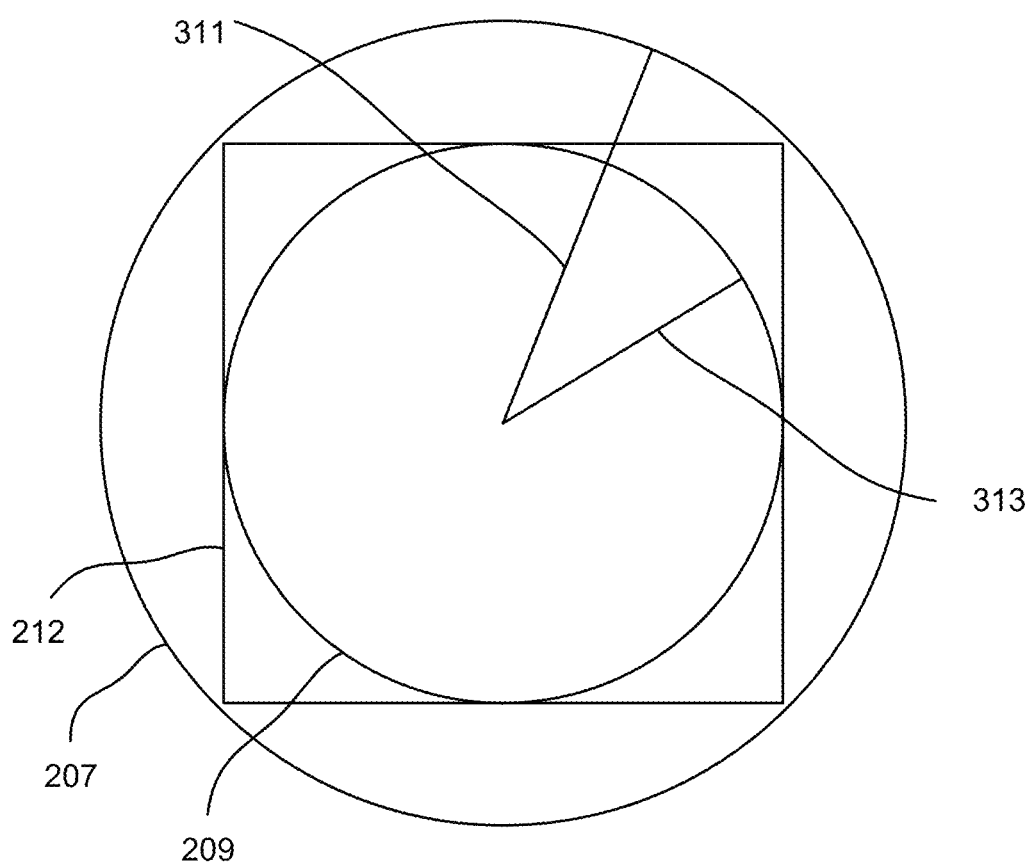
FIG. 3F is a drawing illustrating one embodiment of a ROE-based polytope defined by in outer polytope boundary and an inner polytope boundary.

FIG. 3F is a drawing illustrating one embodiment of a convex polytope 212 defined by an outer polytope boundary 207 and an inner polytope boundary 109. The convex 212 may be a convex shape. In the depicted embodiment, the convex polytope 212 is a cube. However, a three-dimensional convex polytope shape may be employed. The outer polytope boundary 207 has an outer polytope radius 311. The inner polytope boundary has an inner polytope radius 313.

In one embodiment, the inner polytope boundary 209 is modeled as the convex shape of the convex polytope 212. The reduced complexity of the convex shape may reduce the computational overhead of determining that the inner polytope boundary is breached, improved the efficiency of the embodiments.

Figure 3G:
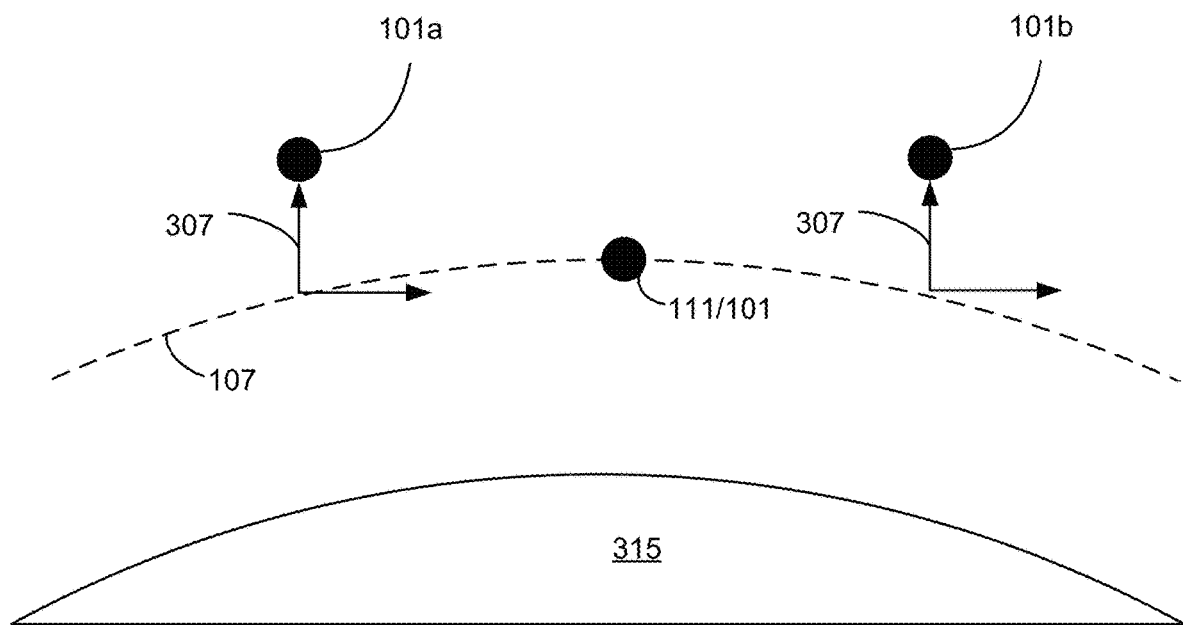
FIG. 3G is a drawing illustrating one embodiment of an agent spacecraft orbit.
Figure 3H:
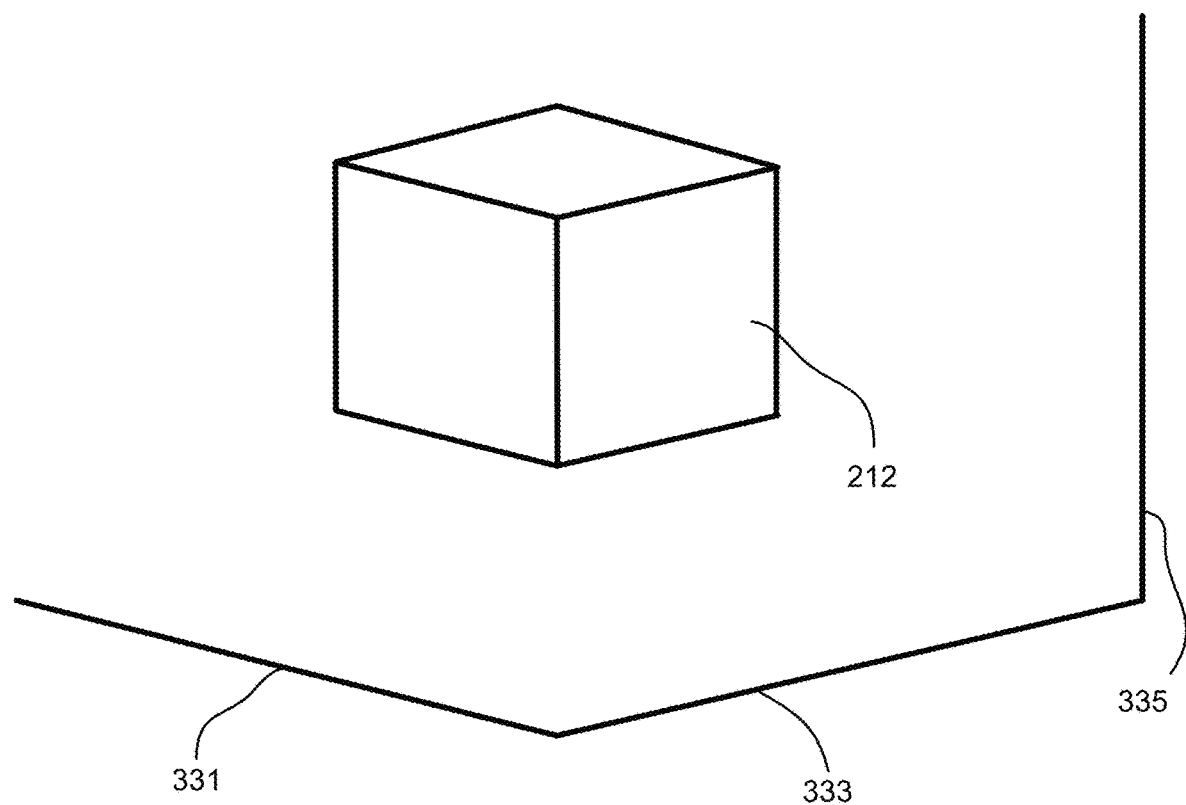
FIG. 3H is a drawing illustrating of one embodiment of a cube-based polytope.

FIG. 3G is a drawing illustrating one embodiment of an agent spacecraft orbit relative to a virtual point 111. The virtual point 111 may be a spacecraft 111. The virtual point 111 follows an orbital path 107 about the earth 315. The orbital path 107 may be a drift trajectory. The agent spacecraft 101a has a flight path/drift trajectory 307 relative to the virtual point 111. In the depicted embodiment, the flight path/drift trajectory 307 is shown comprising vertical and horizontal components.

FIG. 3H is a drawing illustrating of one embodiment of a convex polytope 212. In the depicted embodiment, the convex polytope 212 is a cube. The convex polytope 212 is shown along the radial axis 331, the along orbital track axis 333, and the cross-orbital track axis 335.

Figure 3I:
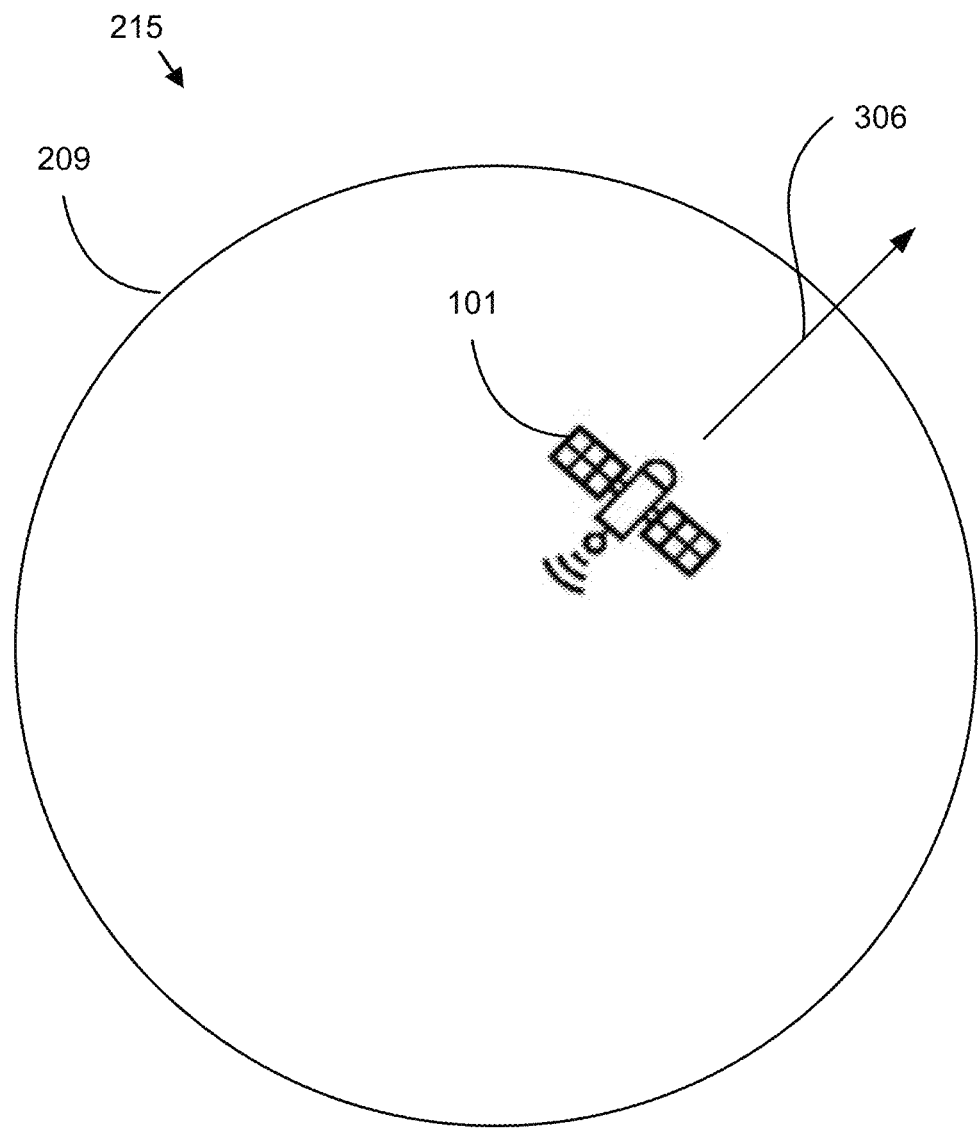
FIG. 3I is a drawing illustrating one embodiment of a maneuver strategy.

FIG. 3I is a drawing illustrating one embodiment of an optimal guidance maneuver strategy 215. In the depicted embodiment, a spacecraft 101 is shown within an inner polytope boundary 209. The spacecraft 101 is determined to drift 306 to breach the inner polytope boundary 209.

Figure 3J:
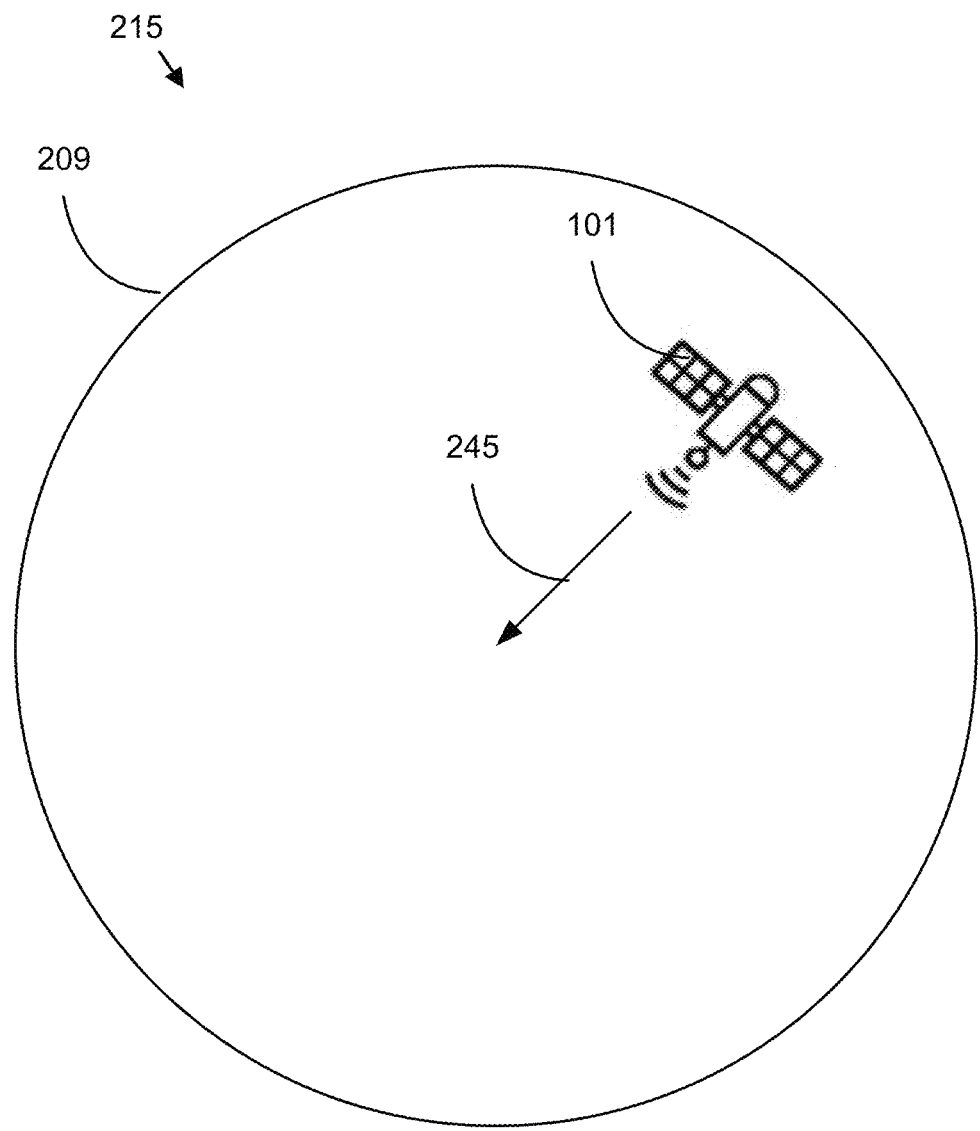
FIG. 3J is a drawing illustrating one embodiment of a maneuver strategy.

FIG. 3J is a drawing illustrating one embodiment of an optimal guidance maneuver strategy 215. In the depicted embodiment, a guidance trajectory 245 is calculated to maneuver the spacecraft 101 of FIG. 3I to prevent the spacecraft 101 from breaching the inner polytope boundary 209.

Figure 3K:
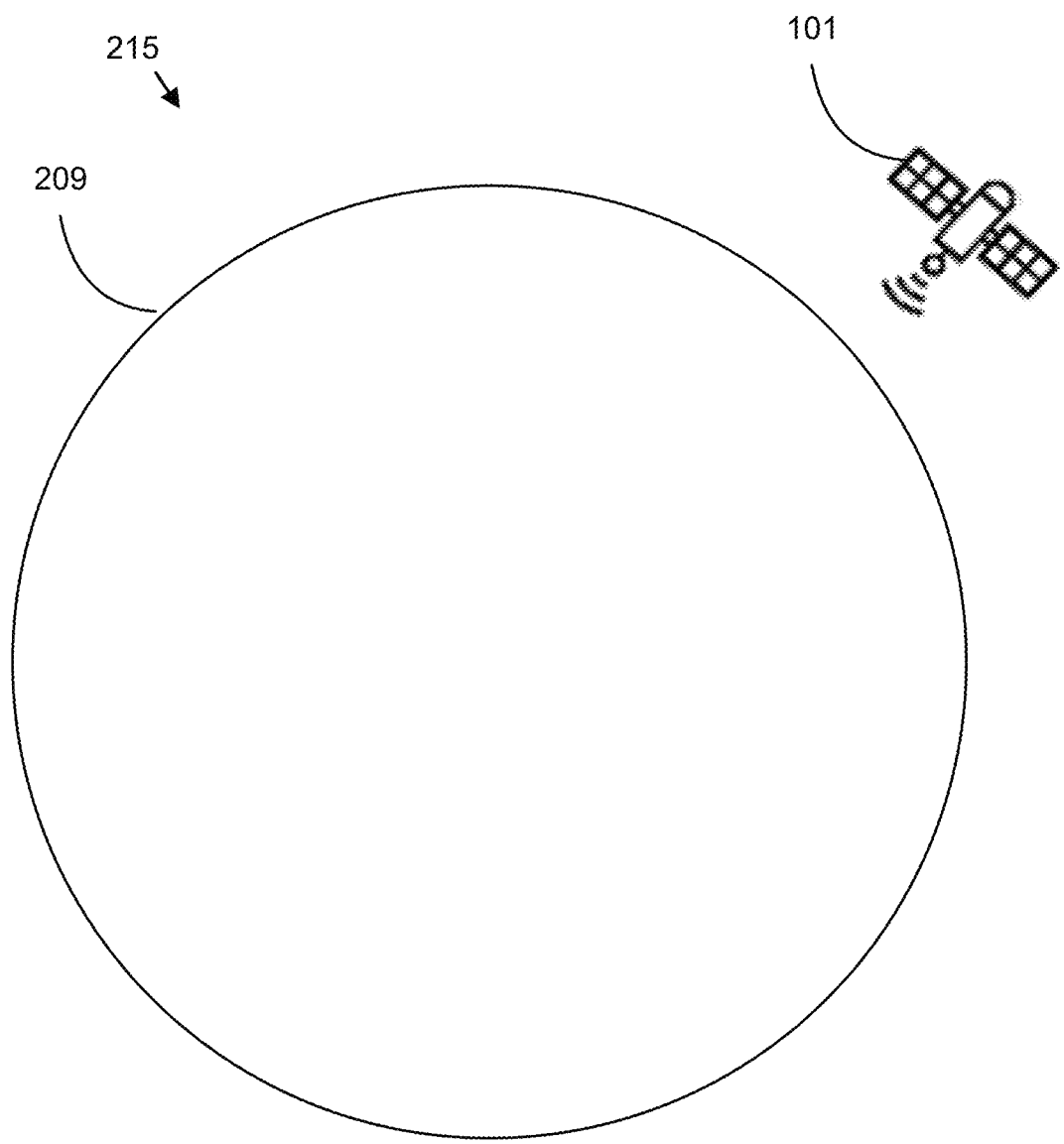
FIG. 3K is a drawing illustrating one embodiment of a maneuver strategy.

FIG. 3K is a drawing illustrating one embodiment of an optimal guidance maneuver strategy 215. In the depicted embodiment, a spacecraft 101 is shown outside an inner polytope boundary 209.

Figure 3L:
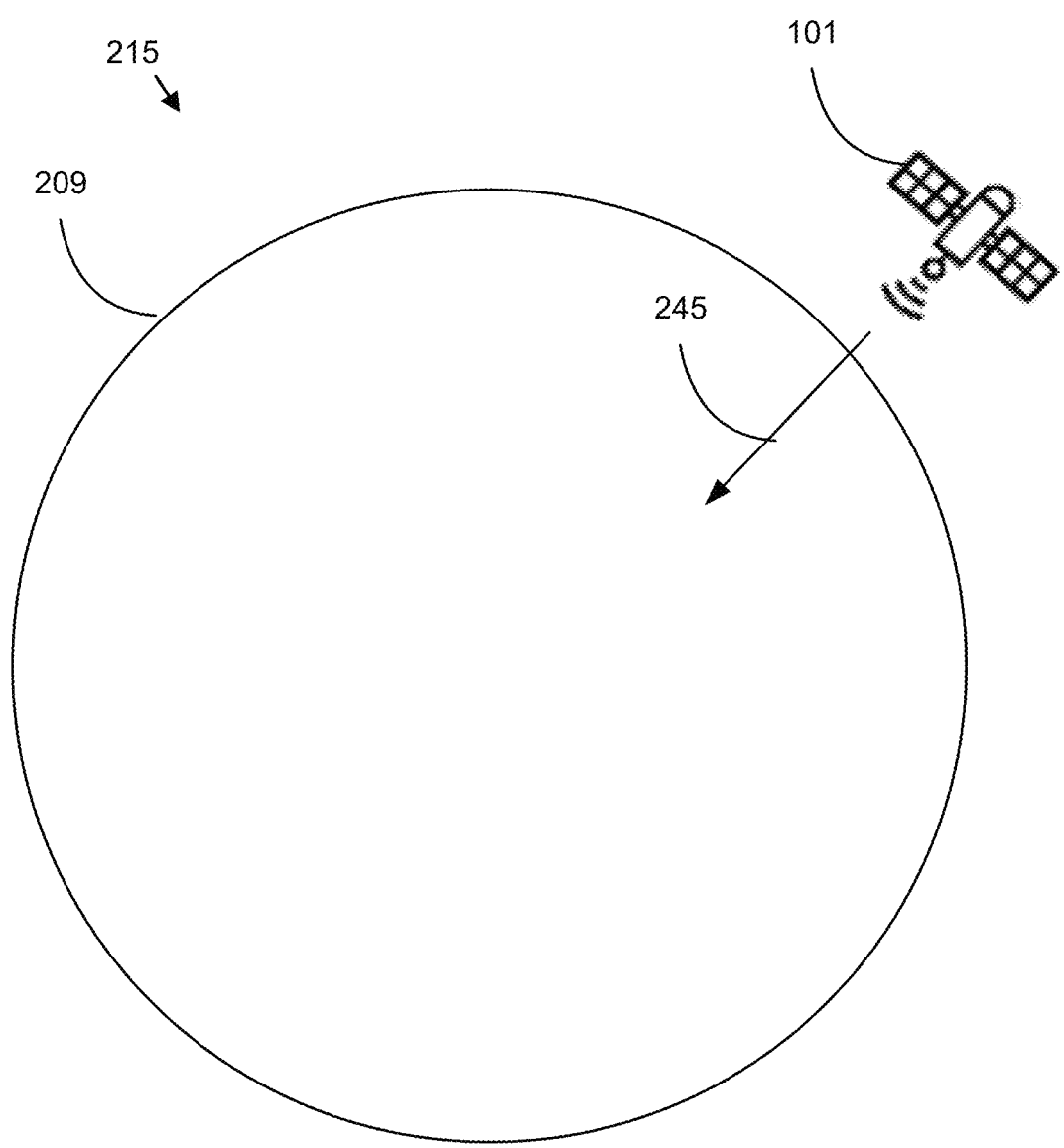
FIG. 3L is a drawing illustrating one embodiment of a maneuver strategy.

FIG. 3L is a drawing illustrating one embodiment of an optimal guidance maneuver strategy 215. In the depicted embodiment, a guidance trajectory 245 is calculated to maneuver the spacecraft 101 of FIG. 3K to within the inner polytope boundary 209 in response to detecting the spacecraft 101 outside of the inner polytope boundary 209.

Figure 4:
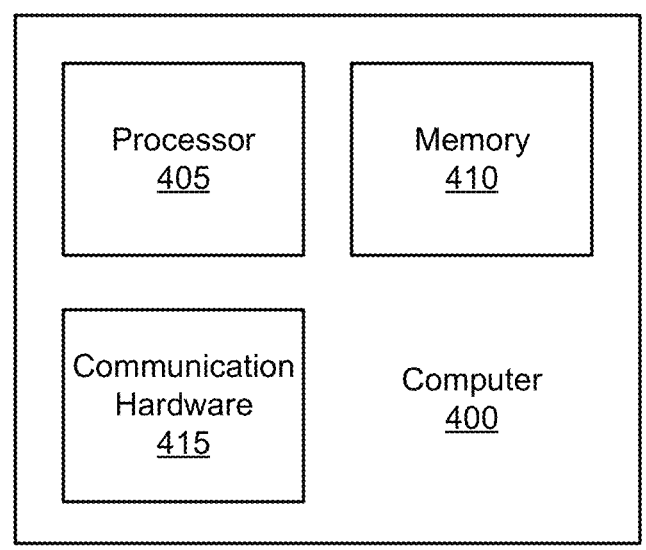
FIG. 4 is a schematic block diagram illustrating one embodiment of a computer.

FIG. 4 is a schematic block diagram illustrating one embodiment of a computer 400. The computer 400 may be embodied in a spacecraft 101 and/or ground station 103. In the depicted embodiment, the computer 400 includes a processor 405, a memory 410, and communication hardware 415. The memory 410 may store code and data. The processor 405 may execute the code and process the data. The communication hardware 415 may communicate with other devices such as spacecraft 101 and ground stations 103.

Figure 5A:
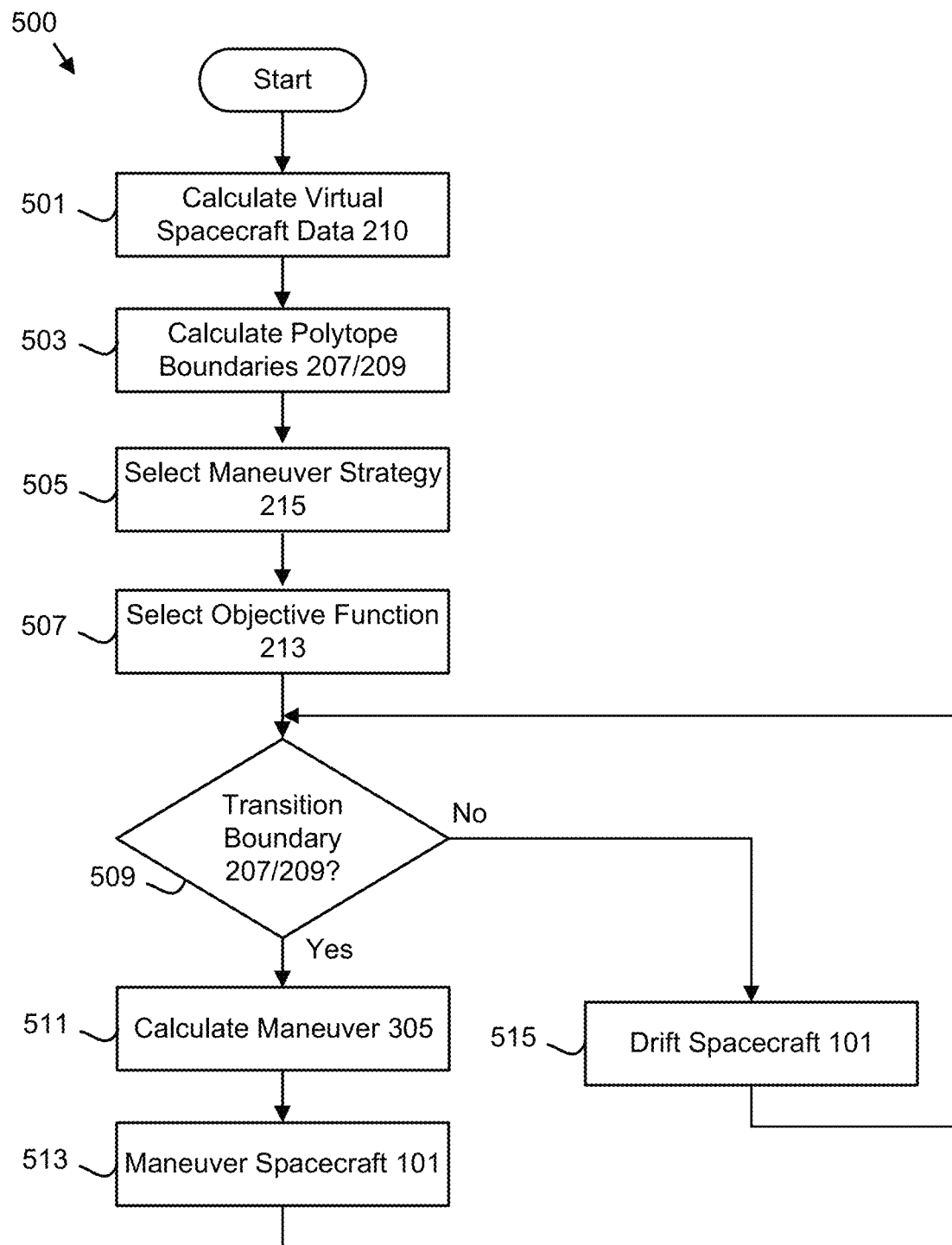
FIG. 5A is a schematic flow chart diagram illustrating one embodiment of a spacecraft control method.

FIG. 5A is a schematic flow chart diagram illustrating one embodiment of a spacecraft control method 500. The method 500 may maneuver the spacecraft 101 within a spacecraft formation 109. The method 500 may be performed by the computer 400 and/or processor 405.

The method 500 starts, and in one embodiment, the processor 405 calculates 501 the virtual spacecraft data 201 for a virtual point 111. The spacecraft data 201 may be calculated 501 from sensor data. In addition, the spacecraft data 201 may be calculated 501 from ground station data. The virtual point 111 may represent a plurality of spacecraft 101 orbiting in a spacecraft formation 109. In addition, the virtual point 111 may represent a lead spacecraft 101.

The processor 405 may calculate 503 the outer polytope boundary 207 and/or the inner polytope boundary 209 relative to the virtual point 111 for a given spacecraft 101. In addition, the processor 405 may calculate 503 the drift horizon 225. The outer polytope boundary 207 and the inner polytope boundary 209 may have a common center. The outer polytope boundary 207 and the inner polytope boundary 209 may be calculated 503 to maintain the distance threshold 205 between the given spacecraft 101 and the virtual point 111. The outer polytope boundary 207 and the inner polytope boundary 209 may be calculated 503 to maintain a vector of the distance threshold 205 between the given spacecraft 101 and the virtual point 111.

In one embodiment, the processor 405 calculates 503 only an inner polytope boundary 209. The inner polytope boundary 209 may have an inner polytope radius 313. A spacecraft 101 may be maneuvered to within the inner polytope boundary 209. The processor 405 may further calculate 503 the outer polytope boundary 207. The outer polytope boundary 209 may have an outer polytope radius 311.

The processor 405 may select 505 a maneuver strategy 215. The maneuver strategy may be an optimal guidance maneuver strategy 215. In one embodiment, the maneuver strategy 215 may be selected 505 from the group consisting of the large maneuver strategy 215 and the small maneuver strategy 215. The maneuver strategy 215 may be selected based on forecast maneuvers 305.

The processor 405 may select 507 an objective function 213. The selected objective function 213 may minimize fuel consumption. In one embodiment, the selected objective function 213 minimizes velocity change 217. In one embodiment, the $L_2$ objective function 213 is used.

In one embodiment, the processor 405 determines 509 whether the given spacecraft 101 will breach the inner polytope boundary 209. The processor 405 may determine 509 the given spacecraft 101 will exit the inner polytope boundary 209 based on the drift horizon 225. In one embodiment, the given spacecraft 101 is determined 507 to breach the inner polytope boundary 209 if the given spacecraft will exit the inner polytope boundary 209 within a specified time interval such as 5 to 60 minutes.

In one embodiment, the processor 405 determines 509 whether the given spacecraft 101 will exit the outer polytope boundary 207. The processor 405 may determine 509 the given spacecraft 101 will exit the outer polytope boundary 207 based on the drift horizon 225. In one embodiment, the given spacecraft 101 is determined 507 to exit the outer polytope boundary 207 if the given spacecraft will exit the outer polytope boundary 207 within a specified time interval such as 5 to 60 minutes. In a certain embodiment, the given spacecraft 101 is determined 507 to enter the inner polytope boundary 209 if the given spacecraft will enter the inner polytope boundary 209 within the specified time interval.

If the processor 405 determines 509 that the given spacecraft 101 will not exit the outer and/or inner polytope boundary 207/209, the processor 405 allows the given spacecraft 101 to drift 515. The processor 405 may drift 515 the spacecraft 101 by taking no action. The processor 405 will further loop to determine 509 whether the given spacecraft 101 will exit the outer polytope boundary 207.

If the processor 405 determines 509 that the given spacecraft 101 will exit the outer and/or polytope boundary 207/209, the processor 405 may calculate 511 a maneuver 305 for the given spacecraft 101 using the MPC 219. In one embodiment, the guidance trajectory 245 and/or maneuver 305 is calculated 511 using Equation 24 and/or Equation 40. The guidance trajectory 245 and/or maneuver 305 may be calculated 511 to minimize fuel consumption for the spacecraft 101. The calculation 511 may be relative to the virtual point 111. The calculation 511 of the maneuver 305 for each spacecraft 101 of the spacecraft formation 109 may be performed independently.

The processor 405 further maneuvers 513 the given spacecraft 101 to within the inner polytope boundary 209 using the MPC 219 and the method 500 ends. In one embodiment, the spacecraft 101 is maneuvered 513 within the inner polytope boundary 209 based on the switching condition 251, the guidance law 253, and/or the MPC 255. The spacecraft 101 may be maneuvered 513 subject to an objective function 213 comprising a control usage weight R, a state error weight Q and a terminal error weight P as shown for Equation 24. In one embodiment, the guidance law 253 and/or the MPC 255 are applied to maneuvering 513 the given spacecraft 101 in response to the switching condition of a drift trajectory of the given spacecraft 101 breaching the inner polytope boundary 209. The given spacecraft 101 may be maneuvered 513 using the selected maneuver strategy 215 and/or calculated maneuver 305. The processor 405 may activate thrusters to maneuver 513 the spacecraft 101.

In one embodiment, the spacecraft 101 is maneuvered 513 to not breach an outer polytope boundary 207. In a certain embodiment, the spacecraft 101 begins maneuvering 513 after the outer polytope boundary 207 is breached and is maneuvered 513 until the spacecraft 101 is within the inner polytope boundary 209.

In one embodiment, the spacecraft 101 is maneuvered 513 in response to breaching the inner polytope boundary 209. The spacecraft 101 may be maneuvered 513 to remain within the outer polytope boundary 207. Alternatively, the spacecraft 101 may be maneuvered 513 to remain within the inner polytope boundary 209.

In one embodiment, the spacecraft 101 is maneuvered 513 in response to determining the spacecraft 101 will breach the inner polytope boundary 209. The spacecraft 101 may be maneuvered 513 to remain within the inner polytope boundary 209.

Figure 5B:
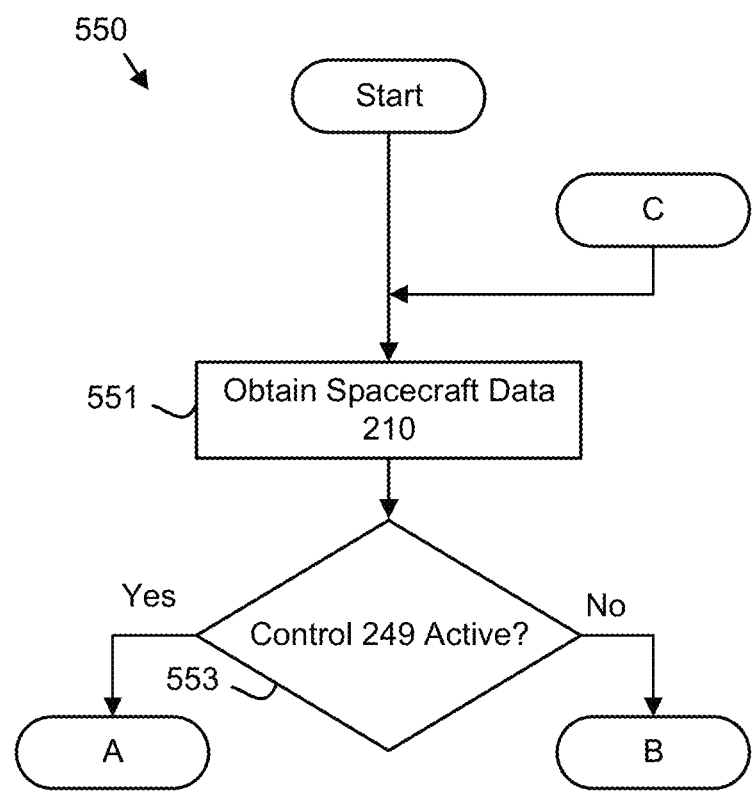
FIG. 5B-D is a schematic flow chart diagram illustrating one embodiment of a spacecraft control method.
Figure 5C:
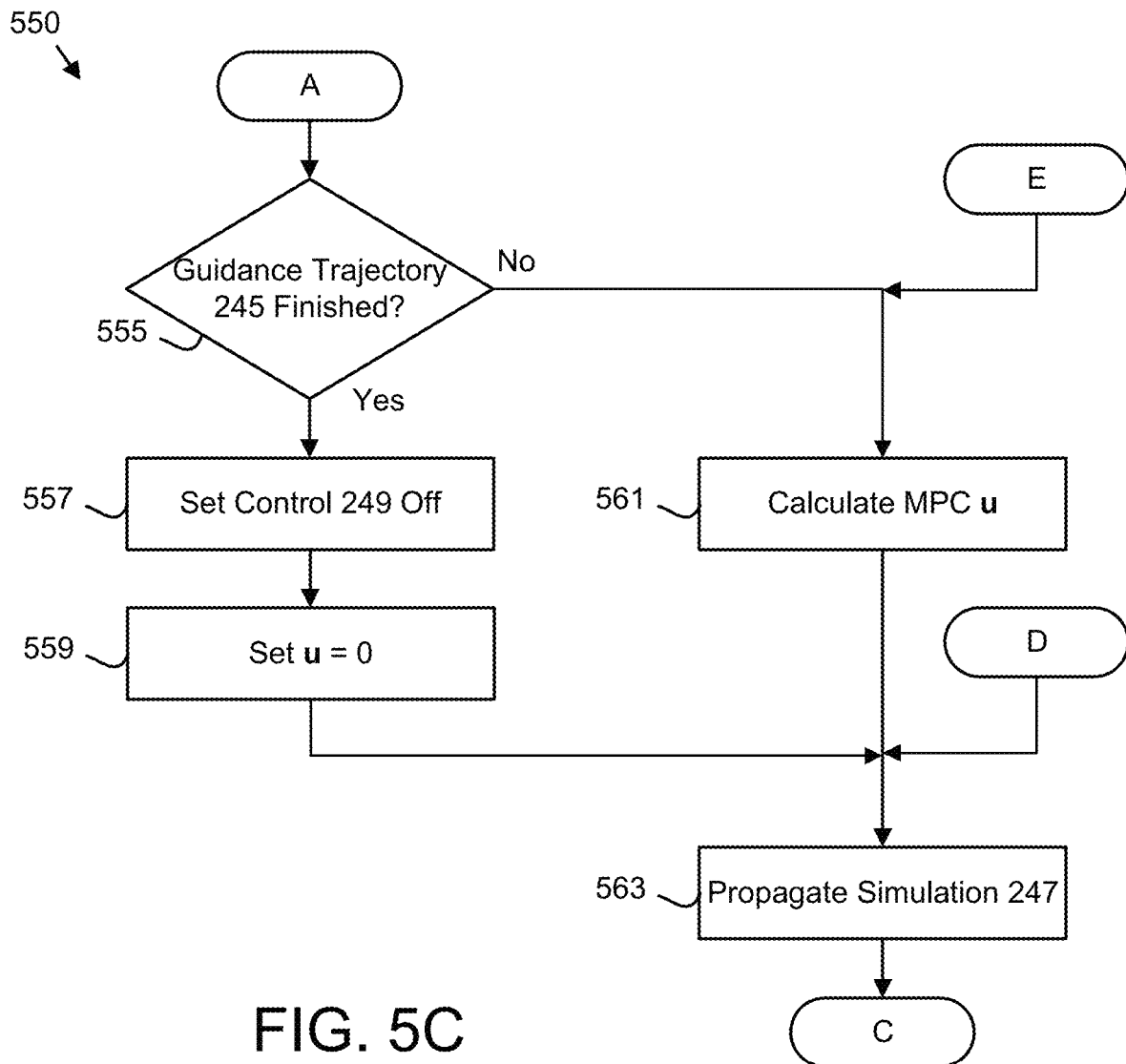
Figure 5D:
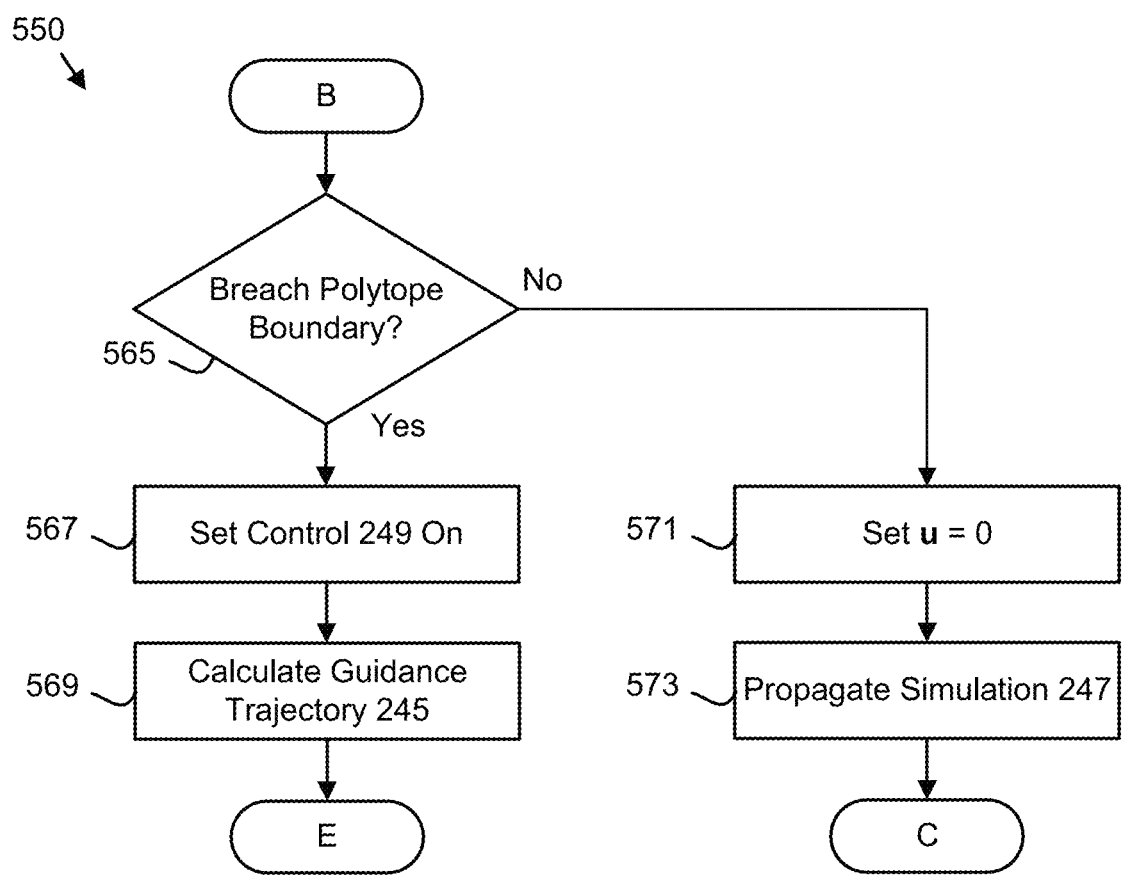

FIG. 5B-D is a schematic flow chart diagram illustrating one embodiment of a spacecraft control method 550. The method 550 may maneuver the spacecraft 101 within a spacecraft formation 109. The method 550 may be performed by the computer 400 and/or processor 405 and employ model predictive control to control a spacecraft 101 and/or simulate control of a spacecraft 101.

The method 550 starts, and in one embodiment, the processor 405 obtains 551 the spacecraft data 201. The spacecraft data 201 may be obtained 551 from sensors and/or a ground station 103. Alternatively, the spacecraft data 201 may be obtained 551 from a simulation 247.

The processor 405 determines 553 whether control 249 for the spacecraft 101 is active. If control 249 is active, the processor 405 determines 555 whether a guidance trajectory 245 is finished. If the guidance trajectory 245 is finished, the processor 405 sets 557 control 249 off. In addition, the processor 405 sets 559 the MPC control vector u to zeros and propagates 563 a simulation 247 of the maneuver. If the guidance trajectory 245 is not finished, the processor 405 calculates 561 the MPC control vector u. The MPC control vector u may be calculated 561 with Equation 40. The processor 405 may propagate 563 a simulation 247 of the maneuver.

If the processor 405 determines 553 that control 249 is not active, the processor 405 determines 565 whether the spacecraft 101 has breached and/or will breach a polytope boundary 207/209. For example, the processor 405 may determine 565 whether the spacecraft 101 has breached and/or will breach the inner polytope boundary 209. Alternatively, the processor 405 may determine 565 whether the spacecraft 101 has breached and/or will breach the outer polytope boundary 207.

If the spacecraft 101 has breached the polytope boundary 207/209, the processor 405 may set 567 control 249 on. In addition, the processor 405 may calculate 569 a guidance trajectory 245. The processor 405 may further calculate 561 the MPC control vector u. The guidance trajectory 245 and/or MPC control vector u may be calculated 569 with Equation 40. The guidance trajectory 245 and/or MPC control vector u may be calculated 569 subject to an objective function 213 such as the fourth objective function 312d comprising the control usage weight R, the state error weight Q, and the terminal error weight P. The processor 405 may further propagate 573 a simulation 247 of the guidance trajectory 245.

$$\min_{x_{g,k}, u_{g,k}} \frac{1}{2} \sum_{k=0}^{N_g-1} \|u_{g,k}\|_{R_g,P} + \frac{1}{2} \|x_{e,N}\|_{P_g,P} \qquad (40)$$

subject to $$x_{g,k+1} = A_D x_{g,k} + B_D u_{g,k}$$

$$k = 0, 1, , N_g - 1$$

$$x_{g,0} = x(0)$$

$$x_{e,k} \leq x_{g,max}$$

$$x_{e,k} \leq x_{g,min}$$

$$x_{e,k} = x_{g,k} - x_{d,k}$$

$$k = 0, 1, , N_g$$

$$u_k \leq u_{max}$$

$$k = 0, 1, , N_g - 1$$

$$u_k \leq -u_{max}$$

$$k = 0, 1, , N_g - 1$$

If the spacecraft 101 has not breached the polytope boundary 207/209, the processor 405 may set 571 the MPC control vector u to zeros and propagate 573 the simulation 247. After propagating 563/573 the method 505 loops to obtain 551 the spacecraft data 201.

Figure 6A:
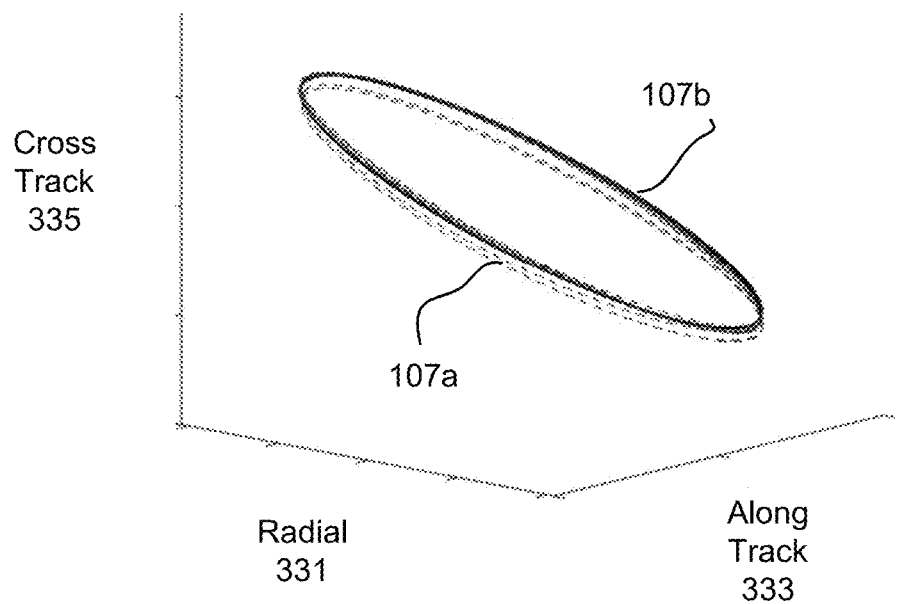
FIG. 6A is a graph illustrating one embodiment of simulated orbital paths.

FIG. 6A is a graph illustrating one embodiment of simulated orbital paths 107. Actual orbital paths (dotted) 107a calculated with an ROE-based polytope 208 using the method 500 of FIG. 5 and a desired orbital path (solid) 107b are shown in an LVLH frame. The actual orbital paths 107a closely approximate the desired orbital path 107b. The simulation is based on the parameters in Table 2.

TABLE 2

| Parameter | Value |
|---|---|
| Spacecraft Mass | 24 kilograms (kg) |
| Spacecraft $C_D$ | 2.2 |
| Spacecraft Area to Mass | 0.001 m²/kg |
| Spacecraft Thrust | 0.5 Newtons |
| Simulation Timestep | 10 seconds (s) |
| Simulation Timesteps | 8640 steps |
| MPC Horizon | 60 steps |
| Drift Horizon 225 | 15 steps |

Table 3 defines the reference orbit of the virtual point 111 used in the simulation.

TABLE 3

| Keplerian Orbital Element | Value |
|---|---|
| Semi-major Axis | 6878 kilometers (km) |
| Eccentricity | $1 \times 10^{-4}$ |
| Inclination | 25 degrees |
| Right ascension of the ascending node | 45 degrees |
| Argument of Perigee | 0 degrees |
| Initial True Anomaly | 100 degrees |

Table 4 shows the relative orbital elements used for the spacecraft 101 in the simulation.

TABLE 4

| Relative Orbital Element | Value |
|---|---|
| $\delta a$ | 0 |
| $\delta \lambda$ | 0 |
| $\delta e_x$ | $3 \times 10^{-3}$ |
| $\delta e_y$ | $3 \times 10^{-4}$ |
| $\delta i_x$ | $3 \times 10^{-4}$ |
| $\delta i_y$ | 0 |

In one embodiment, for each point along the desired orbital path 107, a volume of space is defined using the method described above. The polytope boundary $b_{bound}$ 207/209 constraint may be defined as shown in Equations 41-43.

$$A_{bound}\xi \leq b_{bound} \quad (41)$$

where $$A_{bound} = \begin{bmatrix} A_{poly,1} & 0 & & 0 & 0 & 0 \\ 0 & A_{poly,2} & & 0 & 0 & 0 \\ \vdots & \vdots & \ddots & \vdots & \vdots & \ddots & \vdots \\ 0 & 0 & & A_{poly,N} & 0 & 0 \end{bmatrix} \quad (42)$$

$$b_{bound} = \begin{bmatrix} b_{poly,1}^T & b_{poly,2}^T & b_{poly,N}^T \end{bmatrix}^T \quad (43)$$

with $A_{poly,k}$ and $b_{poly,k}$ referring to the polytope boundaries 207/209 corresponding to the kth point along the desired orbital path 107. The $A_{poly,k}$ matrix is padded with zeros to properly match whichever. While each $A_{poly,k}$ has the same number of columns, the number of rows is free to vary as long as each $A_{poly,k}$ matches its corresponding $b_{poly,k}$. This allows the polytope boundary 207/209 at each timestep k to vary with the only requirement being that the polytope is convex. The spherical polytope boundary 207/209 such as shown in FIG. 3A is fixed relative to a spacecraft's desired state but moves as the trajectory moves in the LVLH frame.

Figure 6B:
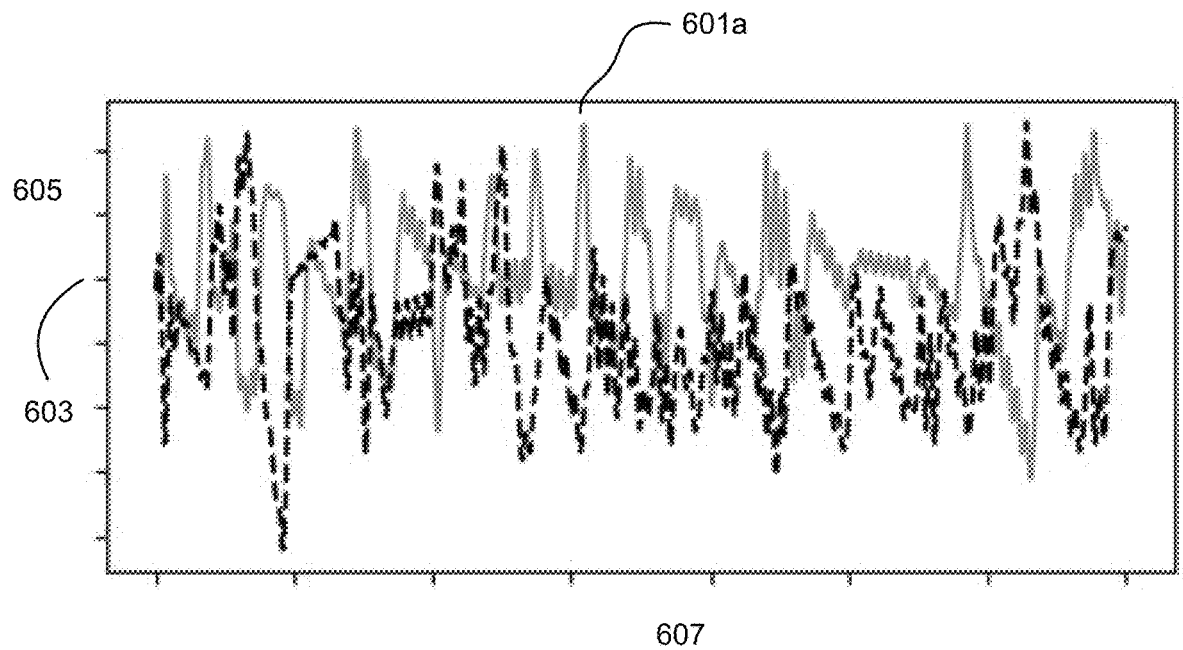
FIG. 6B is a graph illustrating one embodiment of controlled spacecraft separation distances.

FIG. 6B is a graph illustrating one embodiment of controlled spacecraft separation distances. The separation distances are simulated based on the embodiments described herein. The separation distance 601a between a first spacecraft 101 and a second spacecraft 101 is shown relative to a target separation distance 603 of a separation distance range 605 over time 607. In addition, the separation distance 601b between the first spacecraft 101 and a third spacecraft 101 is also shown. In the depicted embodiment, the depicted embodiment, each tick of the separation distance range 605 is 0.1 kilometers (km) and each tick of the time 607 is one day. As shown, the separation distances 601a/b remain near the target separation distance 603.

Figure 6C:
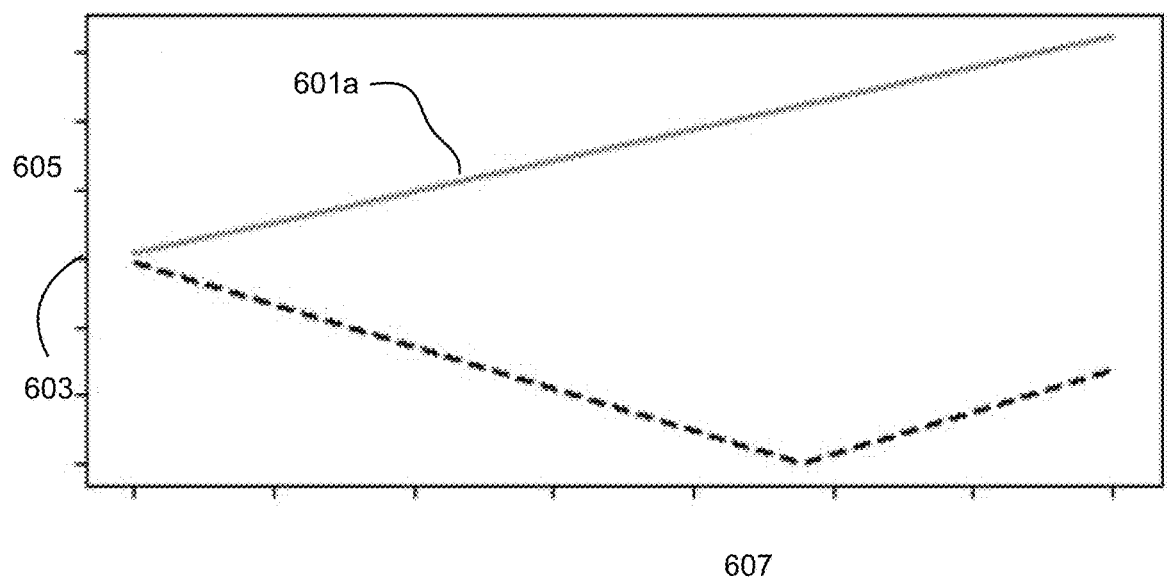
FIG. 6C is a graph illustrating one embodiment of uncontrolled spacecraft separation distances.

FIG. 6C is a graph illustrating one embodiment of uncontrolled spacecraft separation distances. The separation distance 601a between the first spacecraft 101 and the second spacecraft 101 of FIG. 6B is shown relative to a target separation distance 603 of a separation distance range 605 over time 607 and the separation distance 601b between the first spacecraft 101 and the third spacecraft 101 of FIG. 6B is also shown. In the depicted embodiment, each tick of the separation distance range 605 is 1.0 kilometers (km) and each tick of the time 607 is one day. As shown, the separation distances 601a/b rapidly diverges from the target separation distance 603.

The embodiments employ the virtual point 111, the outer polytope boundary 207, and the inner polytope boundary 209 to simplify calculating maneuvers 305 to maintain each spacecraft 101 at a desired position within the spacecraft formation 109. As a result, the efficiency and effectiveness of the computer 400 is improved.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method comprising:
calculating, by use of a processor, a virtual point that represents a plurality of spacecraft orbiting in a spacecraft formation;
iteratively calculating an inner polytope boundary relative to the virtual point for a given spacecraft of the plurality of spacecraft; and
in response to determining the inner polytope boundary will be breached, maneuvering the given spacecraft to within the inner polytope boundary based on a switching condition, a guidance law, and model predictive control (MPC) to minimize fuel consumption, subject to an objective function comprising a control usage weight, a state error weight, and a terminal error weight.

2. The method of claim 1, wherein the objective function is $J(x,u)_p = \|u_0\|_{R,p} + \Sigma_{k=1}^{N-1}[\|x_k\|_{Q,p} + \|u_k\|_{R,p}] + \|x_N\|_{P,p}$ wherein $x_k$ is a motion vector at step k, $x_N$ is a final motion vector, $u_k$ is a control vector at step k, $u_0$ is an initial control vector, R is the control usage weight, Q is the state error weight, and P is the terminal error weight.

3. The method of claim 1, wherein the guidance law and the MPC are applied to maneuvering the given spacecraft in response to the switching condition of a drift trajectory of the given spacecraft breaching the inner polytope boundary.

4. The method of claim 1, wherein the inner polytope boundary is modeled as a convex shape.

5. The method of claim 4, wherein the given spacecraft is further maneuvered to not breach an outer polytope boundary.

6. The method of claim 5, wherein the convex shape fits within an outer polytope radius and outside an inner polytope radius.

7. An apparatus comprising:
a processor storing code on memory to perform:
calculating a virtual point that represents a plurality of spacecraft orbiting in a spacecraft formation;
iteratively calculating an inner polytope boundary relative to the virtual point for a given spacecraft of the plurality of spacecraft; and
in response to determining the inner polytope boundary will be breached, maneuvering the given spacecraft to within the inner polytope boundary based on a switching condition, a guidance law, and model predictive control (MPC) to minimize fuel consumption, subject to an objective function comprising a control usage weight, a state error weight, and a terminal error weight.

8. The apparatus of claim 7, wherein the objective function is $J(x,u)_p = \|u_0\|_{R,p} + \Sigma_{k=1}^{N-1}[\|x_k\|_{Q,p} + \|u_k\|_{R,p}] + \|x_N\|_{P,p}$ wherein $x_k$ is a motion vector at step k, $x_N$ is a final motion vector, $u_k$ is a control vector at step k, $u_0$ is an initial control vector, R is the control usage weight, Q is the state error weight, and P is the terminal error weight.

9. The apparatus of claim 7, wherein the guidance law and the MPC are applied to maneuvering the given spacecraft in response to the switching condition of a drift trajectory of the given spacecraft breaching the inner polytope boundary.

10. The apparatus of claim 7, wherein the inner polytope boundary is modeled as a convex shape.

11. The apparatus of claim 10, wherein the given spacecraft is further maneuvered to not breach an outer polytope boundary.

12. The apparatus of claim 11, wherein the convex shape fits within an outer polytope radius and outside an inner polytope radius.

13. A computer program product comprising a non-transitory readable storage medium storing code readable by a processor to perform:
  calculating a virtual point that represents a plurality of spacecraft orbiting in a spacecraft formation;
  iteratively calculating an inner polytope boundary relative to the virtual point for a given spacecraft of the plurality of spacecraft; and
  in response to determining the inner polytope boundary will be breached, maneuvering the given spacecraft to within the inner polytope boundary based on a switching condition, a guidance law, and model predictive control (MPC) to minimize fuel consumption, subject to an objective function comprising a control usage weight, a state error weight, and a terminal error weight.

14. The computer program product of claim 13, wherein the objective function is $J(x,u)_p = \|u_0\|_{R,p} + \Sigma_{k=1}^{N-1}[\|x_k\|_{Q,p} + \|u_k\|_{R,p}] + \|x_N\|_{P,p}$ wherein $x_k$ is a motion vector at step k, $x_N$ is a final motion vector, $u_k$ is a control vector at step k, $u_0$ is an initial control vector, R is the control usage weight, Q is the state error weight, and P is the terminal error weight.

15. The computer program product of claim 13, wherein the guidance law and the MPC are applied to maneuvering the given spacecraft in response to the switching condition of a drift trajectory of the given spacecraft breaching the inner polytope boundary.

16. The computer program product of claim 13, wherein the inner polytope boundary is modeled as a convex shape.

17. The computer program product of claim 16, wherein the given spacecraft is further maneuvered to not breach an outer polytope boundary.

* * * * *